(12) United States Patent
Tonami et al.

(10) Patent No.: US 6,295,316 B1
(45) Date of Patent: Sep. 25, 2001

(54) AUTOMATIC EQUALIZATION SYSTEM

(75) Inventors: Junichiro Tonami; Takashi Kiyofuji, both of Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/081,671

(22) Filed: May 20, 1998

(30) Foreign Application Priority Data

May 26, 1997 (JP) ..................................................... 9-151529

(51) Int. Cl.[7] ...................................................... H03H 7/40
(52) U.S. Cl. ........................... 375/230; 375/233; 375/232; 369/48; 369/59
(58) Field of Search ................................. 375/230, 276, 375/233, 350, 232; 369/48, 59; 331/11

(56) References Cited

U.S. PATENT DOCUMENTS

| 5,568,330 | 10/1996 | Sawaguchi et al. | 360/46 |
|---|---|---|---|
| 5,790,613 | * 8/1998 | Tateishi | 375/276 |
| 5,841,323 | * 11/1998 | Fujimoto | 331/11 |
| 5,850,377 | * 12/1998 | Taguchi et al. | 369/48 |
| 5,902,533 | * 7/1999 | Honma | 369/59 |

FOREIGN PATENT DOCUMENTS

| 0595454 | 5/1994 | (EP) . |
|---|---|---|
| 0618574 | 10/1994 | (EP) . |
| 7-296524 | 11/1995 | (JP) . |
| 10-134513 | 5/1998 | (JP) . |
| 9610254 | 4/1996 | (WO) . |

OTHER PUBLICATIONS

"Optical Reception for Binary Partial Response Channels" by Ferguson; Bell Syst. Tech. J., vol. 51, No. 2; Feb. 1972: pp. 493–505.

"Recent Developments of Signal Processing in Digital Magnetic Storage" by Mita; The Transactions of the Institute of Electronics, Information and Communication Engineerings; Nov. 1992; pp. 611–623 (w/partial English translation).

* cited by examiner

*Primary Examiner*—Stephen Chin
*Assistant Examiner*—Shuwang Liu
(74) *Attorney, Agent, or Firm*—Louis Woo

(57) ABSTRACT

An automatic equalization system includes an analog-to-digital converter for periodically sampling an analog signal representative of digital information in response to a sampling clock signal, and for converting every sample of the analog signal into a corresponding digital sample to convert the analog signal into a corresponding digital signal. A first device operates for detecting a phase error of the sampling clock signal in response to a correlation between samples of the digital signal generated by the analog-to-digital converter. A second device operates for controlling a frequency of the sampling clock signal in response to the phase error detected by the first device. A variable filter operates for subjecting the digital signal generated by the analog-to-digital converter to a variable filtering process to convert the digital signal generated by the analog-to-digital converter into a filtering-resultant signal. The filtering process corresponds to a waveform equalization process. A third device operates for detecting an amplitude error of the digital signal generated by the analog-to-digital converter in response to a correlation between samples of the filtering-resultant signal generated by the variable filter. A fourth device operates for controlling the filtering process implemented by the variable filter in response to the amplitude error detected by the third device. The analog-to-digital converter, the first device, and the second device compose a phase locked loop while the variable filter, the third device, and the fourth device compose an amplitude error correcting loop separate from the phase locked loop.

5 Claims, 14 Drawing Sheets

AUTOMATIC EQUALIZATION SYSTEM

BACKGROUND OF THE INVENTION

1. Field of the Invention

This invention relates to an automatic equalization system for suppressing errors in a transmitted digital information signal. Also, this invention relates to a noise reduction circuit. Furthermore, this invention relates to a phase lock control circuit.

2. Description of the Related Art

It is known to transmit digital video and audio information signals via limited frequency bands. Also, it is known to reproduce digital video and audio information signals from recording mediums. The rate of errors in such a digital information signal tends to be adversely affected by noise. In addition, the rate of errors depends on the characteristic of a transmission path, the type of a recording medium, or the type of transmission.

There are prior-art automatic equalization systems of various types which operate to suppress errors in transmitted digital information signals. The prior-art automatic equalization systems implement level control, bit synchronization control, and waveform equalization. The level control adjusts the maximum level of signal samples at a given level to enable accurate detection of values represented by a transmitted digital information signal. The bit synchronization control adjusts a sampling clock signal into timing agreement with moments at which data bits are present. The waveform equalization compensates for deteriorations in high frequency components and low frequency components of a transmitted digital information signal, and also for inter-symbol interferences.

Generally, calibration and adjustment of portions of the prior-art automatic equalization systems are relatively complicated.

SUMMARY OF THE INVENTION

It is a first object of this invention to provide an improved automatic equalization system.

It is a second object of this invention to provide an improved noise reduction circuit.

It is a third object of this invention to provide an improved phase lock control circuit.

A first aspect of this invention provides an automatic equalization system comprising an analog-to-digital converter for periodically sampling an analog signal representative of digital information in response to a sampling clock signal, and for converting every sample of the analog signal into a corresponding digital sample to convert the analog signal into a corresponding digital signal; first means for detecting a phase error of the sampling clock signal in response to a correlation between samples of the digital signal generated by the analog-to-digital converter; second means for controlling a frequency of the sampling clock signal in response to the phase error detected by the first means; a variable filter for subjecting the digital signal generated by the analog-to-digital converter to a variable filtering process to convert the digital signal generated by the analog-to-digital converter into a filtering-resultant signal, the filtering process corresponding to a waveform equalization process; third means for detecting an amplitude error of the digital signal generated by the analog-to-digital converter in response to a correlation between samples of the filtering-resultant signal generated by the variable filter; and fourth means for controlling the filtering process implemented by the variable filter in response to the amplitude error detected by the third means; wherein the analog-to-digital converter, the first means, and the second means compose a phase locked loop while the variable filter, the third means, and the fourth means compose an amplitude error correcting loop separate from the phase locked loop.

A second aspect of this invention is based on the first aspect thereof, and provides an automatic equalization system wherein the first means comprises means for detecting the phase error in response to three successive samples of the digital signal generated by the analog-to-digital converter.

A third aspect of this invention is based on the first aspect thereof, and provides an automatic equalization system wherein the phase error of the sampling clock signal which is detected by the first means is defined relative to the analog signal.

A fourth aspect of this invention is based on the first aspect thereof, and provides an automatic equalization system wherein the first means comprises means for comparing a level of every sample of the digital signal generated by the analog-to-digital converter with a reference level, means for adaptively changing the reference level in response to the digital signal generated by the analog-to-digital converter, and means for detecting the phase error in response to a result of the level comparison.

A fifth aspect of this invention provides a noise reduction circuit comprising first means for deciding a level of every sample of an input signal representative of digital information in response to a maximum likelihood related to the input signal; second means for generating an ideal signal in response to the level decided by the first means; third means for calculating a difference between the input signal and the ideal signal generated by the second means; fourth means for generating a corrective signal in response to the difference calculated by the third means; and fifth means for correcting the input signal in response to the corrective signal generated by the fourth means.

A sixth aspect of this invention provides a noise reduction circuit comprising first means for deciding a level of every sample of an input signal representative of digital information in response to a maximum likelihood related to the input signal, and for generating a level decision signal representing the decided level; a first memory for storing successive samples of the level decision signal generated by the first means; a second memory for storing successive samples of the input signal, wherein the signal samples stored in the second memory correspond to the signal samples stored in the first memory respectively; second means for comparing a first pattern represented by a given number of last successive samples of the level decision signal with second patterns represented by the signal samples in the first memory to detect, from among the second patterns, a past pattern corresponding to the first pattern, and for generating an address signal in response to a position of the detected past pattern; third means for selecting a signal sample from among the signal samples in the second memory in response to the address signal generated by the second means; fourth means for calculating a difference between the signal sample selected by the third means and a corresponding sample of the input signal; fifth means for generating a corrective signal in response to the difference calculated by the fourth means; and sixth means for correcting the input signal into a correction-resultant signal in response to the corrective signal generated by the fifth means.

A seventh aspect of this invention is based on the sixth aspect thereof, and provides a noise reduction circuit further comprising seventh means for writing a present sample of the correction-resultant signal over a corresponding signal sample in the second memory.

An eighth aspect of this invention provides a phase lock control circuit comprising an analog-to-digital converter for periodically sampling an analog signal representative of digital information in response to a sampling clock signal, and for converting every sample of the analog signal into a corresponding digital sample to convert the analog signal into a corresponding digital signal; first means for detecting a phase error between the sampling clock signal and the analog signal in response to a maximum likelihood related to the analog signal and also in response to a correlation between samples of the digital signal generated by the analog-to-digital converter; and second means for controlling a frequency of the sampling clock signal in response to the phase error detected by the first means.

A ninth aspect of this invention is based on the eighth aspect thereof, and provides a phase lock control circuit wherein the first means comprises means for detecting the phase error in response to three successive samples of the digital signal generated by the analog-to-digital converter.

DESCRIPTION OF THE PREFERRED EMBODIMENTS

A prior-art automatic equalization system will be explained hereinafter for a better understanding of this invention.

Figure 1:
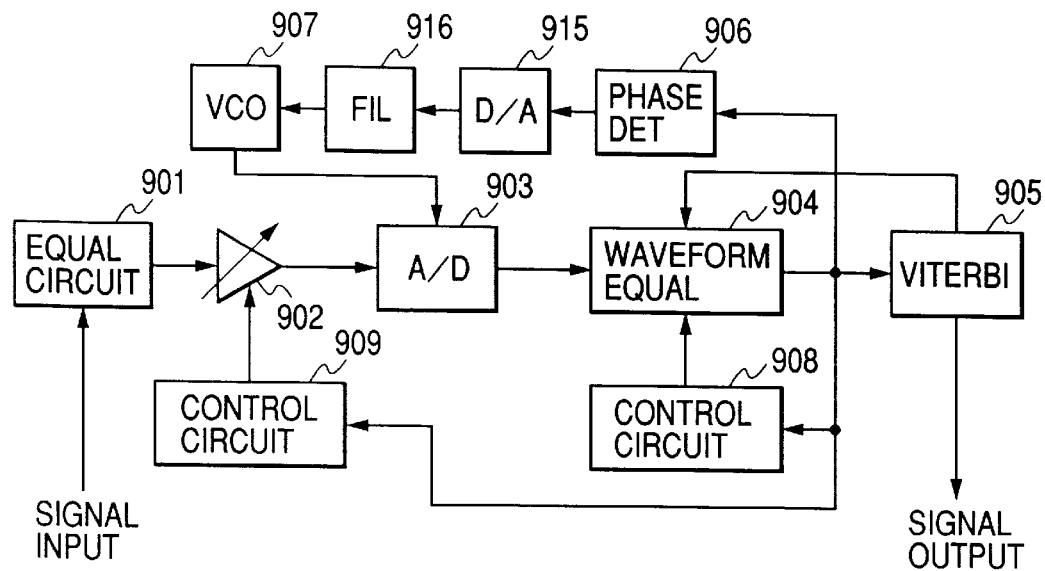
FIG. 1 is a block diagram of a prior-art automatic equalization system.

With reference to FIG. 1, the prior-art automatic equalization system includes an equalization circuit 901, a gain adjustment circuit 902, an analog-to-digital (A/D) converter 903, a waveform equalization circuit 904, a viterbi circuit 905, a phase detection circuit 906, a voltage controlled oscillator (VCO) 907, control circuits 908 and 909, a digital-to-analog (D/A) converter 915, and a filter 916.

In the prior-art automatic equalization system of FIG. 1, an input analog signal representing a digital information signal is applied to the equalization circuit 901, and is subjected thereby to equalization for suppressing inter-symbol interferences caused by a transmission side or a recording side. The equalization circuit 901 is of an analog type. The output signal of the equalization circuit 901, that is, the equalization-resultant signal, is amplified by the gain adjustment circuit 902 at a variable gain. The A/D converter 903 periodically samples the output signal of the gain adjustment circuit 902 in response to a sampling clock signal, and converts every sample of the output signal of the gain adjustment circuit 902 into a digital form. Thus, the A/D converter 903 changes the output signal of the gain adjustment circuit 902 into a corresponding digital signal. The digital signal generated by the A/D converter 903 is processed by the waveform equalization circuit 904. The signal processing by the waveform equalization circuit 904 is designed to correspond to waveform equalization responsive to variable waveform equalization coefficients. The output signal of the waveform equalization circuit 904, that is, the waveform-equalization-resultant signal, is fed to the viterbi circuit 905, the phase detection circuit 906, and the control circuits 908 and 909.

The viterbi circuit 905 recovers a two-value information signal, that is, a digital information signal, from the output signal of the waveform equalization circuit 904 through a decision process. The viterbi circuit 905 outputs the recovered digital information signal to an external device (not shown).

The phase detection circuit 906 generates a digital signal of a phase error in response to the output signal of the waveform equalization circuit 904. The phase error is a difference in timing between the sampling clock signal used by the A/D converter 903 and the signal outputted to the A/D converter 903 from the gain adjustment circuit 902. The phase detection circuit 906 outputs the digital phase error signal to the D/A converter 915. The D/A converter 915 changes the digital phase error signal into a corresponding analog phase error signal. The analog phase error signal is fed from the D/A converter 915 to the voltage controlled oscillator 907 as a control voltage via the filter 916. In general, the filter 916 is of the low pass type. The voltage controlled oscillator 907 generates a signal (a variable-frequency signal) having a frequency which depends on the analog phase error signal. The variable-frequency signal generated by the voltage controlled oscillator 907 is fed to the A/D converter 903 as the sampling clock signal.

The A/D converter 903, the waveform equalization circuit 904, the phase detection circuit 906, the D/A converter 915, the filter 916, and the voltage controlled oscillator 907 compose a phase locked loop. In general, the filter 916 is referred to as a loop filter.

The control circuit 908 generates a signal for control of the waveform equalization coefficients in response to the output signal of the waveform equalization circuit 904. The control circuit 908 outputs the control signal to the waveform equalization circuit 904. The control signal adjusts the waveform equalization coefficients used in the waveform equalization circuit 904. The waveform equalization circuit 904 and the control circuit 908 compose a waveform equalization loop.

The control circuit 909 generates a signal for control of the gain of the gain adjustment circuit 902 in response to the output signal of the waveform equalization circuit 904. The control circuit 909 outputs the control signal to the gain adjustment circuit 902. Accordingly, the control circuit 909 adjusts the gain of the gain adjustment circuit 902.

The gain adjustment circuit 902, the A/D converter 903, the waveform equalization circuit 904, and the control circuit 909 compose a gain control loop.

In the prior-art automatic equalization system of FIG. 1, the A/D converter 903 is common to the phase locked loop and the gain control loop. The waveform equalization circuit 904 is common to the phase locked loop, the gain control loop, and the waveform equalization loop. Thus, the phase locked loop, the gain control loop, and the waveform equalization loop have a common signal path. The common signal path causes calibration and adjustment of portions of the prior-art automatic equalization system to be relatively complicated.

In the prior-art automatic equalization system of FIG. 1, since the phase locked loop contains the waveform equalization circuit 904, the capture range provided by the phase locked loop tends to be relatively narrow.

First Embodiment

Figure 2:
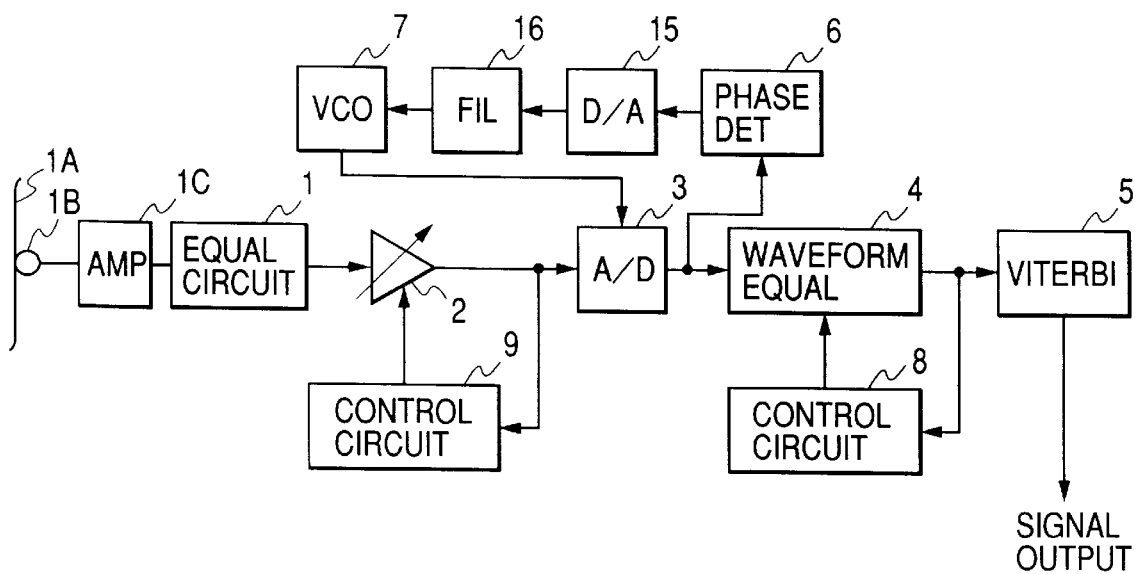
FIG. 2 is a block diagram of an automatic equalization system according to a first embodiment of this invention.

FIG. 2 shows an automatic equalization system according to a first embodiment of this invention. The automatic equalization system of FIG. 2 includes an equalization circuit 1, a gain adjustment circuit 2, an analog-to-digital (A/D) converter 3, a waveform equalization circuit 4, a viterbi circuit 5, a phase detection circuit 6, a voltage controlled oscillator (VCO) 7, control circuits 8 and 9, a digital-to-analog converter (D/A) 15, and a filter 16.

The input terminal of the equalization circuit 1 is connected to a magnetic head 1B via a preamplifier 1C. The magnetic head 1B scans a magnetic tape 1A. It should be noted that a low pass filter may be provided between the preamplifier 1C and the equalization circuit 1. The output terminal of the equalization circuit 1 is connected to the input terminal of the gain adjustment circuit 2. The gain adjustment circuit 2 has a control terminal connected to the output terminal of the control circuit 9. The output terminal of the gain adjustment circuit 2 is connected to the input terminal of the A/D converter 3 and also the input terminal of the control circuit 9. The A/D converter 3 has a clock terminal connected to the output terminal of the voltage controlled circuit 7.

The output terminal of the A/D converter 3 is connected to the input terminal of the waveform equalization circuit 4 and also the input terminal of the phase detection circuit 6. The waveform equalization circuit 4 has a control terminal connected to the output terminal of the control circuit 8. The output terminal of the waveform equalization circuit 4 is connected to the input terminal of the viterbi circuit 5 and also the input terminal of the control circuit 8. The output terminal of the viterbi circuit 5 can be connected to an external device (not shown).

The output terminal of the phase detection circuit 6 is connected to the input terminal of the D/A converter 15. The output terminal of the D/A converter 15 is connected to the input terminal of the filter 16. The output terminal of the filter 16 is connected to the control terminal of the voltage controlled oscillator 7.

The magnetic tape 1A stores a signal including a digital information signal (for example, a digital video/audio signal). The signal stored in the magnetic tape 1A conforms to a partial response format such as a PR(1, 0, −1) format. The magnetic head 1B reproduces the signal from the magnetic tape 1A. The reproduced signal is fed from the magnetic head 1B to the equalization circuit 1 via the preamplifier 1C as an input analog signal representing a digital information signal. It should be noted that a signal representing a digital information signal and being transmitted via a transmission line may be applied to the equalization circuit 1 as an input signal.

The equalization circuit 1 subjects the input analog signal to equalization for suppressing inter-symbol interferences caused by a transmission side or a recording side. The equalization circuit 1 is of an analog type. The output signal of the equalization circuit 1, that is, the equalization-resultant signal, is amplified by the gain adjustment circuit 2 at a variable gain. The A/D converter 3 periodically samples the output signal of the gain adjustment circuit 2 in response to a sampling clock signal, and converts every sample of the output signal of the gain adjustment circuit 2 into a digital form. Thus, the A/D converter 3 changes the output signal of the gain adjustment circuit 2 into a corresponding digital signal. The A/D converter 3 outputs the digital signal to the waveform equalization circuit 4 and the phase detection circuit 6.

The digital signal generated by the A/D converter 3 is processed by the waveform equalization circuit 4. The signal processing by the waveform equalization circuit 4 is designed to correspond to waveform equalization responsive to variable waveform equalization coefficients. The waveform equalization circuit 4 includes a digital transversal filter for implementing the waveform equalization. The output signal of the waveform equalization circuit 4, that is, the waveform-equalization-resultant signal, is fed to the viterbi circuit 5 and the control circuit 8.

The viterbi circuit 5 recovers a two-value information signal, that is, a digital information signal, from the output signal of the waveform equalization circuit 4 through a decision process. The viterbi circuit 5 outputs the recovered digital information signal to an external device (not shown).

The phase detection circuit 6 generates a digital signal of a phase error in response to the output signal of the A/D converter 3. This phase error means an error between the phase of the signal fed to the A/D converter 3 from the gain adjustment circuit 2 and the phase of the sampling clock signal used by the A/D converter 3. The phase detection circuit 6 outputs the digital phase error signal to the D/A converter 15. The D/A converter 15 changes the digital phase error signal into a corresponding analog phase error signal. The analog phase error signal is fed from the D/A converter 15 to the voltage controlled oscillator 7 as a control voltage via the filter 16. In general, the filter 16 is of the low pass type. The voltage controlled oscillator 7 generates a signal (a variable-frequency signal) having a frequency which depends on the analog phase error signal. The variable-frequency signal generated by the voltage controlled oscillator 7 is fed to the A/D converter 3 as the sampling clock signal.

The A/D converter 3, the phase detection circuit 6, the D/A converter 15, the filter 16, and the voltage controlled oscillator 7 compose a phase locked loop. In general, the filter 16 is referred to as a loop filter. The phase locked loop is designed to implement the following processes. When the phase error is negative, the voltage controlled oscillator 7 retards the sampling clock signal for the A/D converter 3 to nullify the phase error. When the phase error is positive, the voltage controlled oscillator 7 advances the phase of the sampling clock signal for the A/D converter 3 to nullify the phase error. Thus, the phase locked loop adjusts the sampling clock signal into phase agreement with the signal fed to the A/D converter 3 from the gain adjustment circuit 2.

The control circuit 8 generates a signal for control of the waveform equalization coefficients in response to the output signal of the waveform equalization circuit 4. The control circuit 8 outputs the control signal to the waveform equalization circuit 4. The control signal adjusts the waveform equalization coefficients used in the waveform equalization circuit 4. The waveform equalization circuit 4 and the control circuit 8 compose a waveform equalization loop.

The control circuit 9 generates a signal for control of the gain of the gain adjustment circuit 2 in response to the output signal of the gain adjustment circuit 2. The control circuit 9 outputs the control signal to the gain adjustment circuit 2. Accordingly, the control circuit 9 adjusts the gain of the gain adjustment circuit 2 in response to the output signal of the gain adjustment circuit 2. The gain adjustment is designed to maintain the amplitude of the output signal of the gain adjustment circuit 2 at a predetermined constant value. The gain adjustment circuit 2 and the control circuit 9 compose a gain control loop.

In the automatic equalization system of FIG. 2, the phase locked loop, the waveform equalization loop, and the gain control loop are separate from each other. This design simplifies calibration and adjustment of portions of the automatic equalization system. Since the waveform equalization circuit 4 is excluded from the phase locked loop, the capture range provided by the phase locked loop can be relatively wide.

Figure 3:
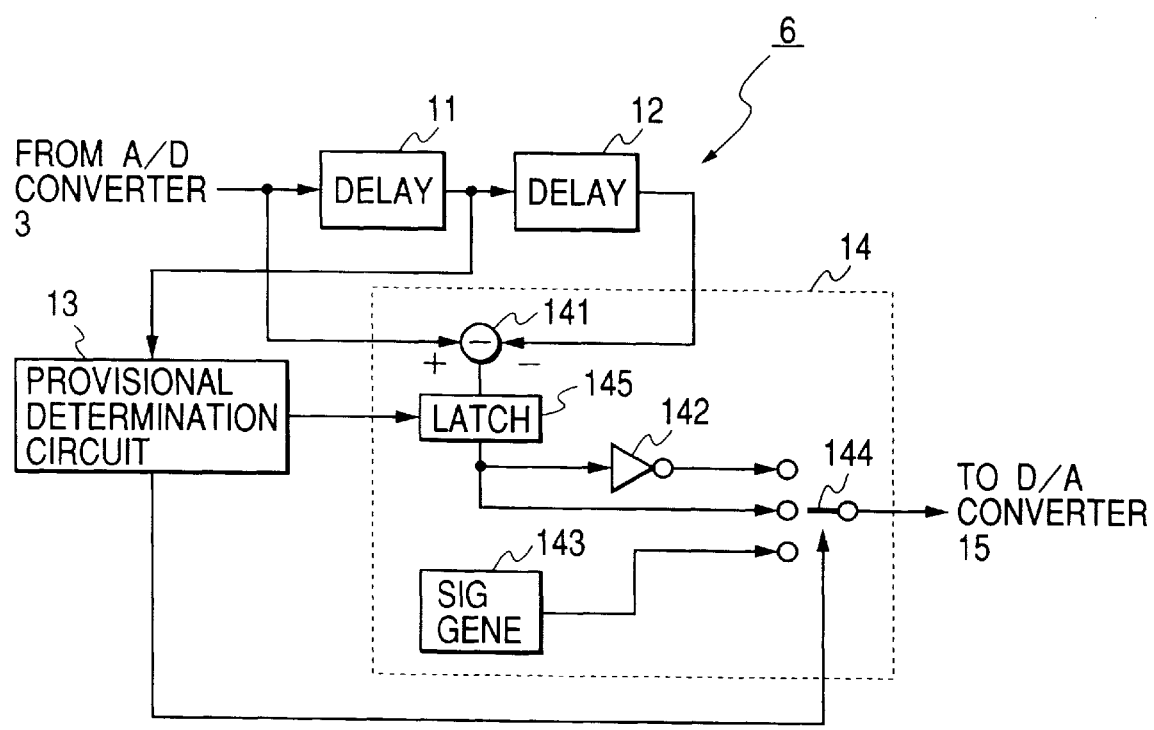
FIG. 3 is a block diagram of a phase detection circuit in FIG. 2.

As shown in FIG. 3, the phase detection circuit 6 includes delay circuits 11 and 12, a provisional determination circuit 13, and an error calculation circuit 14. The error calculation circuit 14 includes a subtracter 141, an inverter 142, a signal generator 143, a switch 144, and a latch 145.

The input terminal of the delay circuit 11 is connected to the output terminal of the A/D converter 3. The output terminal of the delay circuit 11 is connected to the input terminal of the delay circuit 12 and also the input terminal of the provisional determination circuit 13. The output terminal of the delay circuit 12 is connected to a first input terminal of the subtracter 141. A second input terminal of the subtracter 141 is connected to the output terminal of the A/D converter 3. The output terminal of the subtracter 141 is connected to the input terminal of the latch 145. The output terminal of the latch 145 is connected to the input terminal of the inverter 142. The output terminal of the inverter 142 is connected to a first fixed contact of the switch 144. The output terminal of the latch 145 is directly connected to a second fixed contact of the switch 144. The latch 145 has an enabling terminal connected to a first output terminal of the provisional determination circuit 13. The output terminal of the signal generator 143 is connected to a third fixed contact of the switch 144. The switch 144 has a control terminal connected to a second output terminal of the provisional determination circuit 13. The switch 144 has a movable contact which connects with one of the first, second, and third fixed contacts thereof in response to a signal applied to the control terminal. The movable contact of the switch 144 is connected to the input terminal of the D/A converter 15.

The delay circuit 11 receives the output signal of the A/D converter 3. The delay circuit 11 defers the output signal of the A/D converter 3 by a predetermined time corresponding to a 1-sample interval or a 1-bit-corresponding interval. The output signal of the delay circuit 11 is applied to the delay circuit 12 and the provisional determination circuit 13. The delay circuit 12 defers the output signal of the delay circuit 11 by a predetermined time corresponding to a 1-sample interval (a 1-bit-corresponding interval). The output signal of the delay circuit 12 is applied to the subtracter 141. The subtracter 141 receives the output signal of the A/D converter 3. The subtracter 141 generates and outputs a signal corresponding to the output signal of the A/D converter 3 minus the output signal of the delay circuit 12, that is, corresponding to the difference between the output signal of the A/D converter 3 and the output signal of the delay circuit 12.

The provisional determination circuit 13 decides whether the value represented by the output signal of the delay circuit 11 is equal to "1", "0", or "-1". The provisional determination circuit 13 generates first and second control signals depending on the result of the decision. The provisional determination circuit 13 outputs the first control signal to the latch 145 as an enabling signal. The provisional determination circuit 13 outputs the second control signal to the switch 144 as a switch control signal. For example, the switch control signal has two bits. When the provisional determination circuit 13 decides that the value represented by the output signal of the delay circuit 11 is equal to "1", the switch control signal is set in a first state corresponding to "1". When the provisional determination circuit 13 decides that the value represented by the output signal of the delay circuit 11 is equal to "0", the switch control signal is set in a second state corresponding to "0". When the provisional determination circuit 13 decides that the value represented by the output signal of the delay circuit 11 is equal to "-1", the switch control signal is set in a third state corresponding to "-1".

The output signal of the subtracter 141 corresponds to the difference in value between signal samples immediately preceding and following a signal sample currently subjected to the decision by the provisional determination circuit 13.

The latch 145 periodically samples and holds the output signal of the subtracter 141 in response to a system clock signal, for example, the output signal of the voltage controlled oscillator 7 (see FIG. 2). The latch 145 is selectively enabled and disabled in response to the first control signal fed from the provisional determination circuit 13. For example, the first control signal has one bit. The latch 145 is enabled when the first control signal is "1". The latch 145 is disabled when the first control signal is "0". The latch 145 serves as a 1-sample delay circuit when being enabled. When the latch 145 is disabled, the signal held by the latch 145 is inhibited from being updated.

The inverter 142 receives the output signal of the latch 145. The device 142 inverts the output signal of the latch 145, and outputs the inversion-resultant signal to the first fixed contact of the switch 144. The second fixed contact of the switch 144 receives the output signal of the latch 145. The signal generator 143 supplies the third fixed contact of the switch 144 with a predetermined signal which corresponds to a condition where the phase error is null. The movable contact of the switch 144 connects with one of the first, second, and third fixed contacts thereof in response to the switch control signal fed from the provisional determination circuit 13. Thus, the switch 144 selects one of the output signal of the inverter 142, the output signal of the latch 145, and the output signal of the signal generator 143 in response to the switch control signal fed from the provisional determination circuit 13. The switch 144 transmits the selected signal to the D/A converter 15 as the phase error signal.

Specifically, when the provisional determination circuit 13 decides that the output signal of the delay circuit 11 is equal to "1", that is, when the result of the decision by the provisional determination circuit 13 corresponds to "1", the switch 144 selects the output signal of the latch 145. When the provisional determination circuit 13 decides that the output signal of the delay circuit 11 is equal to "−1", that is, when the result of the decision by the provisional determination circuit 13 corresponds to "−1", the switch 144 selects the output signal of the inverter 142. When the provisional determination circuit 13 decides that the output signal of the delay circuit 11 is equal to "0", that is, when the result of the decision by the provisional determination circuit 13 corresponds to "0", the switch 144 selects the output signal of the signal generator 143.

Figure 4:
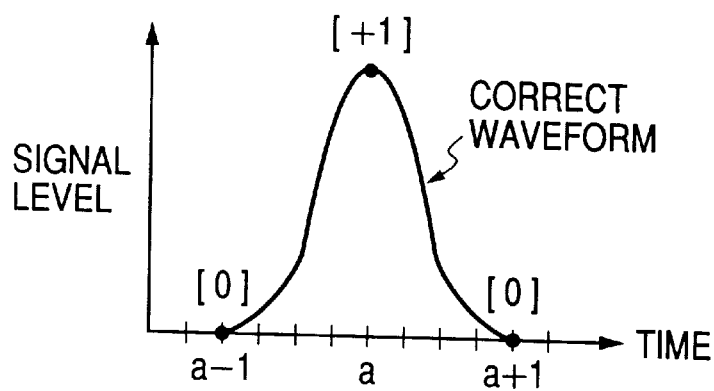
FIG. 4 is a time-domain diagram of a signal waveform corresponding to a bit sequence of "010" which is free from a phase error relative to sampling moments.

FIG. 4 shows the waveform of a signal corresponding to a digital information signal which is "0", "1", and "0" at three successive sampling moments in the absence of a signal phase error relative to the sampling timing. With reference to FIG. 4, at a first sampling moment "a−1", the signal level is zero and a signal state of "0" is detected. At a second sampling moment "a", the signal level is significantly greater than zero and a signal state of "+1" is detected. At a third sampling moment "a+1", the signal level is zero and a signal state of "0" is detected. Thus, in FIG. 4, the difference between the signal levels which occur at the first and third sampling moments "a−1" and "a+1" is equal to zero.

Figure 5:
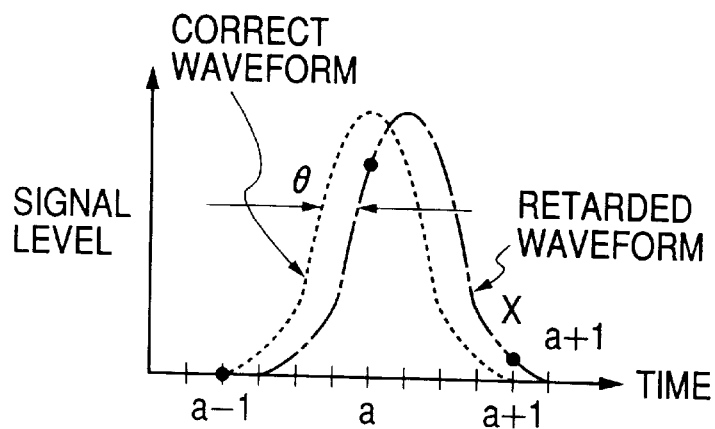
FIG. 5 is a time-domain diagram of a signal waveform corresponding to a bit sequence of "010" which has a phase retardation relative to sampling moments.

FIG. 5 shows the waveform of a signal corresponding to a digital information signal which is "0", "1", and "0" at three successive sampling moments in the presence of a signal phase retardation relative to the sampling timing by a value "θ". With reference to FIG. 5, at a first sampling moment "a−1", the signal level is zero. At a second sampling moment "a", the signal level is significantly greater than zero. At a third sampling moment "a+1", the signal level is equal to a value "X" slightly greater than zero. Thus, in FIG. 5, the difference between the signal levels which occur at the first and third sampling moments "a−1" and "a+1" is equal to the non-zero value "−X". The non-zero value "−X" depends on the signal phase retardation relative to the sampling timing.

Figure 6:
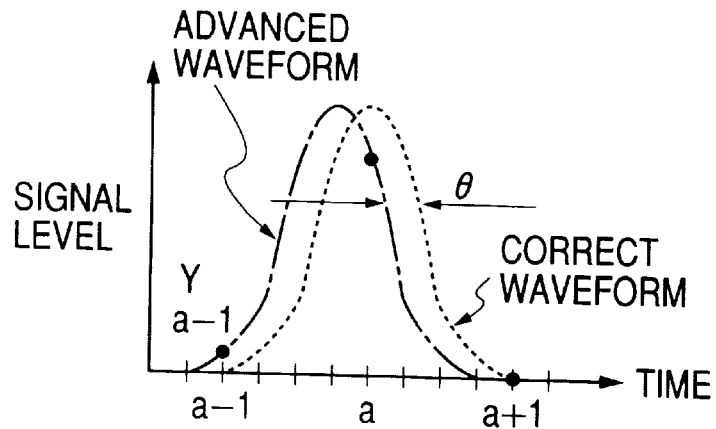
FIG. 6 is a time-domain diagram of a signal waveform corresponding to a bit sequence of "010" which has a phase advance relative to sampling moments.

FIG. 6 shows the waveform of a signal corresponding to a digital information signal which is "0", "1", and "0" at three successive sampling moments in the presence of a signal phase advance relative to the sampling timing by a value "θ". With reference to FIG. 6, at a first sampling moment "a−1", the signal level is equal to a value "Y" slightly greater than zero. At a second sampling moment "a", the signal level is significantly greater than zero. At a third sampling moment "a+1", the signal level is zero. Thus, in FIG. 6, the difference between the signal levels which occur at the first and third sampling moments "a−" and "a+1" is equal to the non-zero value "Y". The non-zero value "Y" depends on the signal phase advance relative to the sampling timing.

As understood from FIGS. 4, 5, and 6, the signal phase error can be detected on the basis of the difference between the signal levels which occur at the first and third sampling moments "a−1" and "a+1" in cases where a signal state of "+1" is detected at the second sampling moment "a". Similarly, the signal phase error can be detected on the basis of the difference between the signal levels which occur at the first and third sampling moments "a−1" and "a+1" in cases where a signal state of "−1" is detected at the second sampling moment "a". The subtracter 141 calculates the difference between the signal levels which occur at the first and third sampling moments "a−1" and "a+1". The provisional determination circuit 13 decides whether the signal sample at the second sampling moment "a" is "1 ", "0", or "−1".

The provisional determination circuit 13 is designed to implement signal processing explained hereinafter.

Figure 7:
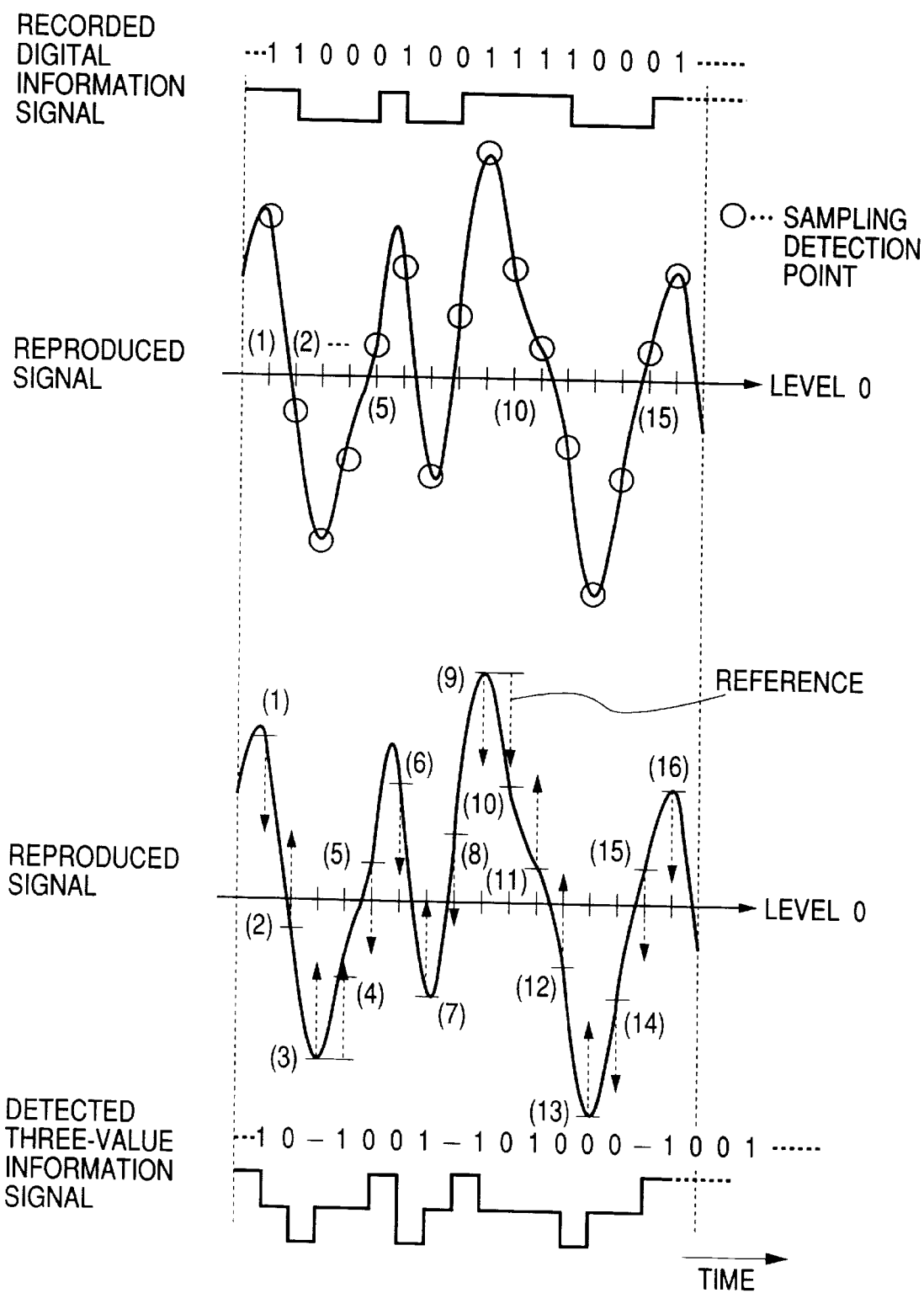
FIG. 7 is a time-domain diagram of signals in the automatic equalization system of FIG. 2.

With reference to FIG. 7, it is assumed that a digital information signal recorded on the magnetic tape 1A has a bit sequence "1100010011110001". In FIG. 7, a three-value information signal detected on the basis of the signal reproduced from the magnetic tape 1A has a level or a value which changes in time domain as "10(−1)001(−1)01000(−1)001". The magnetic recording and reproducing system, and the transversal filter in the waveform equalization circuit 4 have transfer characteristics of "1−D" (a 1-bit delay and a subtraction operator) which cause the time-domain level change of the detected information signal to be different from the bit sequence of the recorded digital information signal. Regarding the detected information signal, each level of "−1" is caused by the inter-symbol interference.

Regarding the magnetic recording of the digital information signal, the transfer function of encoding the digital information signal by the partial response method is expressed as "$1/1-D^2$", which can be divided or converted into "$1/(1-D)(1+D)$". The term "1−D" corresponds to a differential characteristic which can be provided by the signal reproduction. Thus, the reproduced signal is processed according to a "1−D" function so that the previously-indicated time-domain level change "10(−1)001(−1)01000(−1)001" occurs. The waveform-equalization-resultant signal is processed according to a "1+D" (a 1-bit delay and an addition operator) function to recover a two-value information signal therefrom.

With reference to FIG. 7, the signal reproduced from the magnetic tape 1A has an alternating voltage. The reproduced signal is periodically sampled at moments (1), (2), . . . , and (16). It is assumed that at the moment (1), the level of a signal sample which occurs at a sampling moment preceding the moment (1) is decided to be "−1". In this case, at the moment (1), a reference level is set to a given negative-direction value to detect a signal level of "+1".

At the moment (2), the level of the present signal sample exceeds the reference value in the negative direction so that the reference level is changed from the given negative-direction value to a given positive-direction value, and that the level of the signal sample at the moment (1) is decided to be "+1". At this time, it is predicted that the level of a signal sample at the moment (2) is "0" or "−1" since two successive signal samples of "+1" will not occur.

At the moment (3), the level of the present signal sample is closer to "−1" than the level of the signal sample at the moment (2) is. Thus, the level of the signal sample at the moment (2) is decided to be "0".

At the moment (4), the level of the present signal sample is closer to "0" than the level of the signal sample at the moment (3) is. In addition, the level of the present signal sample does not exceed the reference level. Accordingly, the level of the present signal sample, that is, the level of the signal sample at the moment (4), is decided to be "0" while the level of the signal sample at the moment (3) remains undecided.

At the moment (5), the level of the present signal sample exceeds the reference level so that the level of the signal sample at the moment (3) is decided to be "−1". In addition, the reference level is changed from the given positive-direction value to the given negative-direction value.

Regarding the reproduced signal, signal levels of "+1" and "−1" correspond to peaks and valleys formed by sharp portions of the waveform. Therefore, the levels of signal samples around "+1" and "−1" signal samples change across the reference level. In view of this fact, the following design is used. In the case where the level of a signal sample next to a signal sample of interest does not exceeds the reference level and is closer to "0" than the level of the signal sample of interest is, the level of the signal sample of interest remains undecided while the next signal sample is decided to be "0".

For example, at the moment (4), the level of the present signal sample, that is, the level of the signal sample at the moment (4), is decided to be "0" while the level of the signal sample at the moment (3) remains undecided. At the moment (5), the level of the signal sample at the moment (3) is decided. Specifically, at the moment (5), the level of the signal sample at the moment (3) is decided to be "0" if the level of the present signal sample is lower than the level of the signal sample at the moment (3). The level of the signal sample at the moment (3) is decided to be "−1" if the level of the present signal sample is greater than the level of the signal sample at the moment (4) or if the level of the present signal sample exceeds the reference level as shown in FIG. 7.

The levels of signal samples at the moment (5) and later moments are similarly decided while the reference value is similarly updated.

In this way, the provisional determination circuit 13 detects signal samples of "+1" and "−1" which correspond to maximum likelihoods. The provisional determination circuit 13 decides that other signal samples are of "0". Accordingly, even if noise due to an inter-symbol interference is added to an originally-0-level signal sample around a peak or a valley of the waveform, the level of the signal sample can be correctly decided to be "0".

The recording of the digital information signal on the magnetic tape 1A in the partial response method positively uses inter-symbol interferences. Therefore, the reproduced signal has neither successive peaks nor successive valleys. In other words, the reproduced signal has an alternation of peaks and valleys. For example, the digital information signal of 00100 is detected as a three-value information signal of 001(−1)0 in which a signal sample of "−1" immediately following a signal sample of "1" reflects an inter-symbol interference. Accordingly, in the case where two successive signal samples of "+1" occur, one of the two signal samples is caused by noise and is an error.

The provisional determination circuit 13 implements maximum-likelihood-based signal processing to decide which of successive signal samples of "+1" (or "−1") is true. The maximum-likelihood-based signal processing premises that information-representing signal components have a correlation while noise in the reproduced signal does not have any correlation. For example, if a "+1" level of a magnitude is detected at a sampling moment and another "+1" level of a greater magnitude is detected at a next sampling moment, the latter "+1" level is higher in likelihood than the former "+1" level. Thus, in this case, the latter "+1" level is decided to be true while the former "+1" level is decided to be false and is regarded as a "0" level. If a "+1" level is detected at a sampling moment and a "−1" level is detected at a next sampling moment, the "+1" level is high in likelihood. Thus, the result of the decision about a signal sample with a "+1" level depends on the level of a next signal sample. For example, if a "−1" level of an absolute magnitude is detected at a sampling moment and another "−1" level of a greater absolute magnitude is detected at a next sampling moment, the latter "−1" level is higher in likelihood than the former "−1" level. Thus, in this case, the latter "−1" level is decided to be true while the former "−1" level is decided to be false and is regarded as a "0" level.

In the case where the provisional determination circuit 13 decides that the level of the present signal sample is "−1", the sign or the polarity of the output signal of the latch 145 (that is, the sign of the difference between the output signal of the A/D converter 3 and the output signal of the delay circuit 12) is inverted with respect to that available for a signal sample of "+1". Accordingly, when the result of the decision by the provisional determination circuit 13 corresponds to "−1", the provisional determination circuit 13 controls the switch 144 to select the output signal of the inverter 142.

As previously indicated, when the result of the decision by the provisional determination circuit 13 corresponds to "0", the provisional determination circuit 13 controls the switch 144 to select the output signal of the signal generator 143 which corresponds to a condition where the phase error is null.

Figure 8:
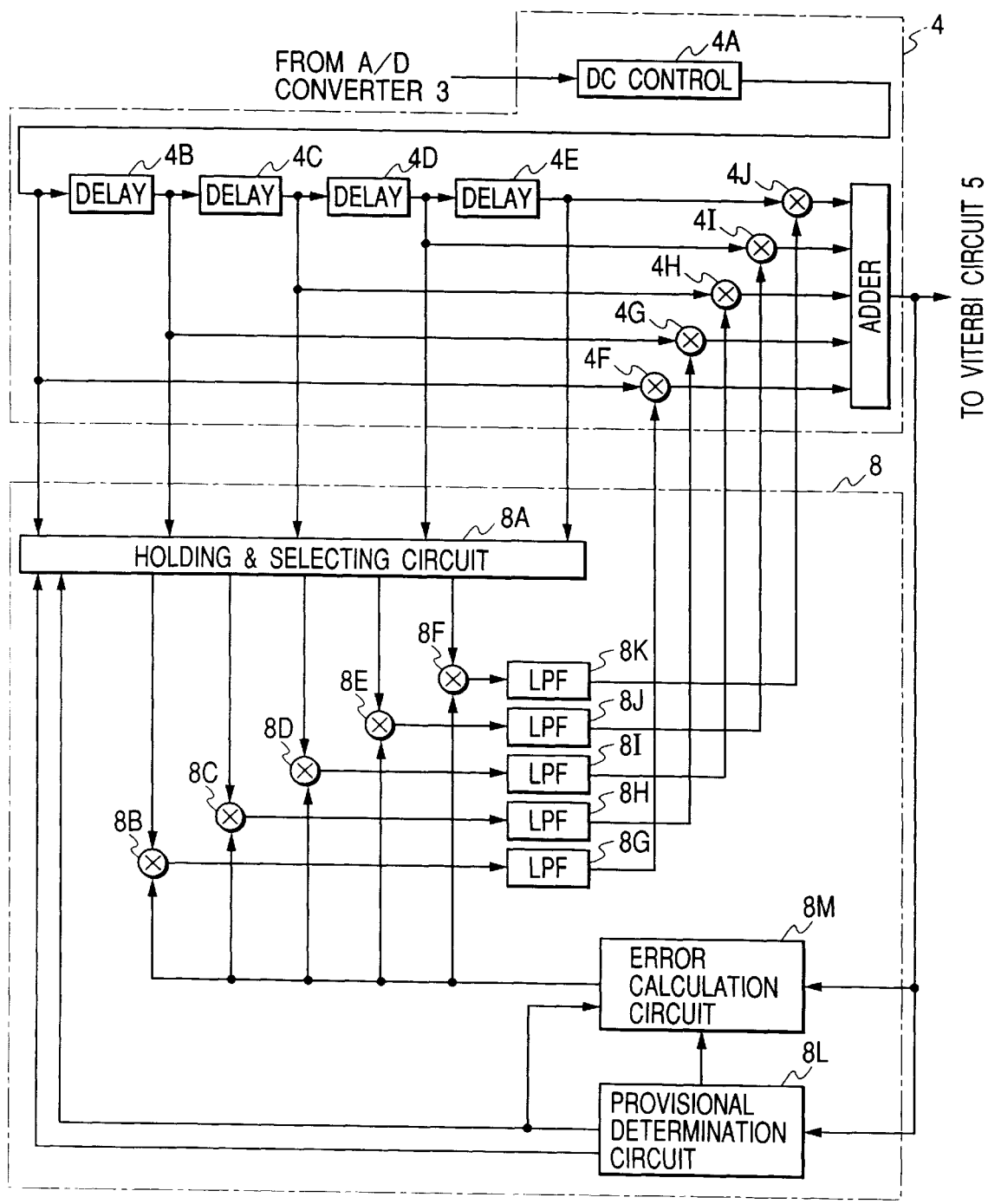
FIG. 8 is a block diagram of a waveform equalization circuit and a related control circuit in FIG. 2.

As shown in FIG. 8, the waveform equalization circuit 4 includes a DC removing circuit or a DC controller 4A, delay circuits 4B, 4C, 4D, and 4E, multipliers 4F, 4G, 4H, 4I, and 4J, and an adder 4K.

The DC removing circuit 4A follows the A/D converter 3. The delay circuits 4B, 4C, 4D, and 4E are connected in cascade in that order. The first delay circuit 4B follows the DC removing circuit 4A. The output terminal of the DC removing circuit 4A is connected to a first input terminal of the multiplier 4F. Also, the output terminal of the DC removing circuit 4A is connected to the control circuit 8. The output terminals of the delay circuits 4B, 4C, 4D, and 4E are connected to first input terminals of the multipliers 4G, 4H, 4I, and 4J, respectively. Second input terminals of the multipliers 4F, 4G, 4H, 4I, and 4J are connected to the control circuit 8. The output terminals of the multipliers 4F, 4G, 4H, 4I, and 4J are connected to input terminals of the adder 4K. The output terminal of the adder 4K is connected to the viterbi circuit 5 and also the control circuit 8.

As shown in FIG. 8, the control circuit 8 includes a holding and selecting circuit 8A, multipliers 8B, 8C, 8D, 8E, and 8F, low pass filters 8G, 8H, 8I, 8J, and 8K, a provisional determination circuit 8L, and an error calculation circuit 8M.

A first input terminal of the holding and selecting circuit 8A is connected to the output terminal of the DC removing circuit 4A within the waveform equalization circuit 4. Second and later input terminals of the holding and selecting circuit 8A are connected to the output terminals of the delay circuits 4B, 4C, 4D, and 4E, respectively. Output terminals of the holding and selecting circuit 8A are connected to first input terminals of the multipliers 8B, 8C, 8D, 8E, and 8F, respectively. The holding and selecting circuit 8A has first and second control terminals which are connected to first and second output terminals of the provisional determination circuit 8L respectively. Second input terminals of the multipliers 8B, 8C, 8D, 8E, and 8F are connected to the output terminal of the error calculation circuit 8M. The output terminals of the multipliers 8B, 8C, 8D, 8E, and 8F are connected to the input terminals of the low pass filters 8G, 8H, 8I, 8J, and 8K, respectively. The output terminals of the low pass filters 8G, 8H, 8I, 8J, and 8K are connected to the second input terminals of the multipliers 4F, 4G, 4H, 4I, and 4J within the waveform equalization circuit 4, respectively. The input terminal of the provisional determination circuit 8L is connected to the output terminal of the adder 4K within the waveform equalization circuit 4. The first output terminal of the provisional determination circuit 8L is connected to a first input terminal of the error calculation circuit 8M. A third output terminal of the provisional determination circuit 8L is connected to a second input terminal of the error calculation circuit 8M. A third input terminal of the error calculation circuit 8M is connected to the output terminal of the adder 4K within the waveform equalization circuit 4.

The DC removing circuit 4A processes the output signal of the A/D converter 3 to set a DC level with respect thereto. The DC removing circuit 4A outputs the processing-resultant signal to the delay circuit 4B. The output signal of the DC removing circuit 4A successively passes through the delay circuits 4B, 4C, 4D, and 4E while being deferred thereby. Each of the delay circuits 4B, 4C, 4D, and 4E provides a predetermined delay corresponding to a 1-sample interval (a 1-bit-corresponding interval). The output signal of the DC removing circuit 4A is applied to the multiplier 4F. The output signals of the delay circuits 4B, 4C, 4D, and 4E are applied to the multipliers 4G, 4H, 4I, and 4J, respectively. The multipliers 4F, 4G, 4H, 4I, and 4J receive output signals of the control circuit 8 which represent tap coefficients respectively. The tap coefficients correspond to the waveform equalization coefficients. The device 4F multiplies the output signal of the DC removing circuit 4A and the related tap coefficient, and outputs the multiplication-resultant signal to the adder 20. The device 4G multiplies the output signal of the delay circuit 4B and the related tap coefficient, and outputs the multiplication-resultant signal to the adder 20. The device 4H multiplies the output signal of the delay circuit 4C and the related tap coefficient, and outputs the multiplication-resultant signal to the adder 20. The device 4I multiplies the output signal of the delay circuit 4D and the related tap coefficient, and outputs the multiplication-resultant signal to the adder 20. The device 4J multiplies the output signal of the delay circuit 4E and the related tap coefficient, and outputs the multiplication-resultant signal to the adder 20. The adder 20 combines the output signals of the multipliers 4F, 4G, 4H, 4I, and 4J into the waveform-equalization-resultant signal.

The delay circuits 4B, 4C, 4D, and 4E, the multipliers 4F, 4G, 4H, 4I, and 4J, and the adder 4K compose the transversal filter.

The control circuit 8 will be further explained below. The provisional determination circuit 8L in the control circuit 8 is similar to the provisional determination circuit 13 in the phase detection circuit 6. The provisional determination circuit 8L decides the level of every sample of the waveform-equalization-resultant signal (that is, the output signal of the adder 20 in the waveform equalization circuit 4). The provisional determination circuit 8L generates first, second, and third control signals depending on the result of the level decision. The provisional determination circuit 8L outputs the first and second control signals to the holding and selecting circuit 8A. The provisional determination circuit 8L outputs the first and third control signals to the error calculation circuit 8M.

Figure 9:
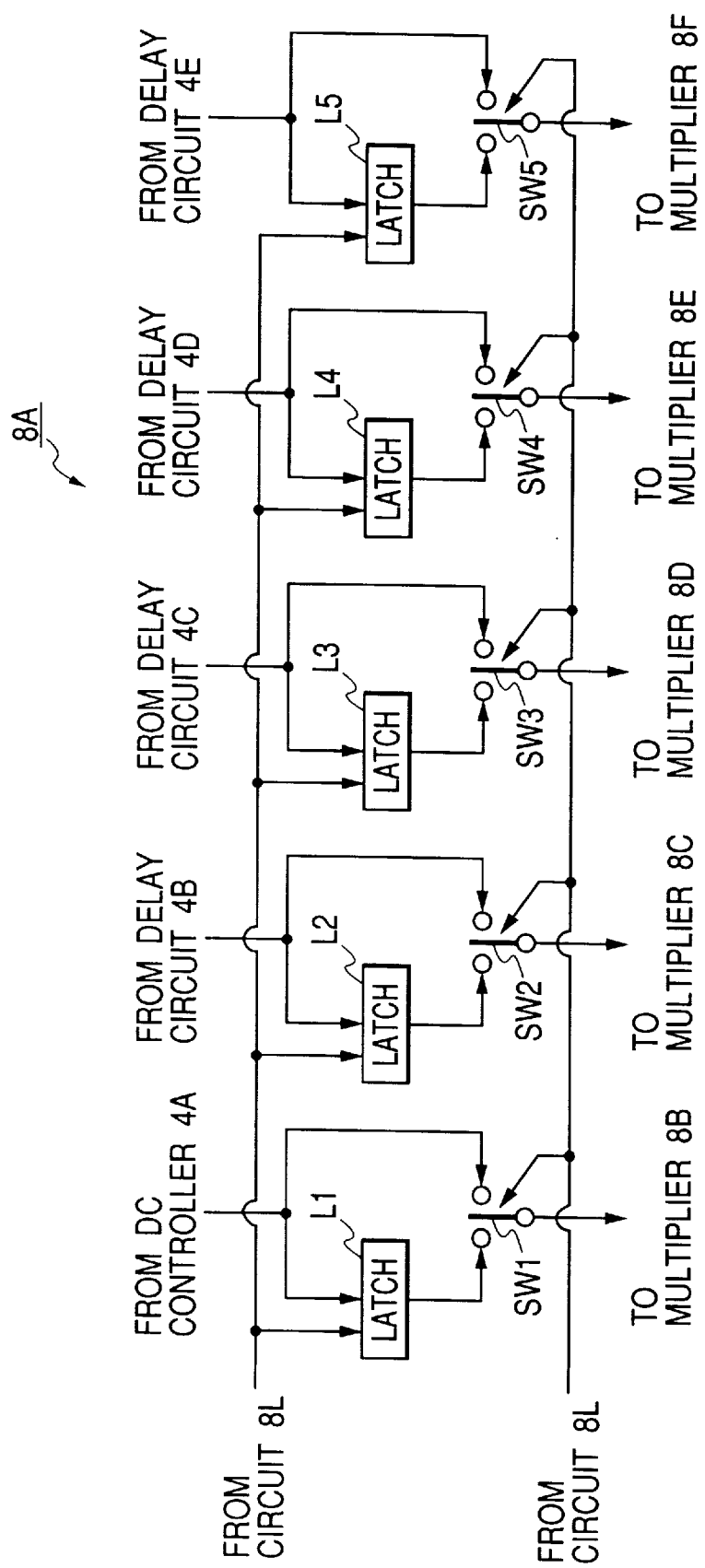
FIG. 9 is a block diagram of a holding and selecting circuit in FIG. 8.

As shown in FIG. 9, the holding and selecting circuit 8A includes latches L1, L2, L3, L4, and L5, and switches SW1, SW2, SW3, SW4, and SW5. The latches L1, L2, L3, L4, and L5 receive the first control signal from the provisional determination circuit 8L as an enabling signal. The switches SW1, SW2, SW3, SW4, and SW5 receive the second control signal from the provisional determination circuit 8L as a switch control signal.

The latch L1 periodically samples and holds the output signal of the DC removing circuit 4A in response to the system clock signal, for example, the output signal of the voltage controlled oscillator 7 (see FIG. 2). The latch L1 is selectively enabled and disabled in response to the first control signal fed from the provisional determination circuit 8L. For example, the first control signal has one bit. The latch L1 is enabled when the first control signal is "1". The latch L1 is disabled when the first control signal is "0". The latch L1 serves as a 1-sample delay circuit when being enabled. When the latch L1 is disabled, the signal held by the latch L1 is inhibited from being updated. The switch SW1 selects one of the output signal of the latch L1 and the output signal of the DC removing circuit 4A in response to the second control signal fed from the provisional determination circuit 8L. The switch SW1 transmits the selected signal to the multiplier 8B.

The latch L2 periodically samples and holds the output signal of the delay circuit 4B in response to the system clock signal. The latch L2 is selectively enabled and disabled in response to the first control signal fed from the provisional determination circuit 8L. The latch L2 is enabled when the first control signal is "1". The latch L2 is disabled when the first control signal is "0". The latch L2 serves as a 1-sample delay circuit when being enabled. When the latch L2 is disabled, the signal held by the latch L2 is inhibited from being updated. The switch SW2 selects one of the output signal of the latch L2 and the output signal of the delay circuit 4B in response to the second control signal fed from the provisional determination circuit 8L. The switch SW2 transmits the selected signal to the multiplier 8C.

The latch L3 periodically samples and holds the output signal of the delay circuit 4C in response to the system clock signal. The latch L3 is selectively enabled and disabled in response to the first control signal fed from the provisional determination circuit 8L. The latch L3 is enabled when the first control signal is "1". The latch L3 is disabled when the first control signal is "0". The latch L3 serves as a 1-sample delay circuit when being enabled. When the latch L3 is disabled, the signal held by the latch L3 is inhibited from being updated. The switch SW3 selects one of the output signal of the latch L3 and the output signal of the delay circuit 4C in response to the second control signal fed from the provisional determination circuit 8L. The switch SW3 transmits the selected signal to the multiplier 8D.

The latch L4 periodically samples and holds the output signal of the delay circuit 4D in response to the system clock signal. The latch L4 is selectively enabled and disabled in response to the first control signal fed from the provisional determination circuit 8L. The latch L4 is enabled when the first control signal is "1". The latch L4 is disabled when the first control signal is "0". The latch L4 serves as a 1-sample delay circuit when being enabled. When the latch L4 is disabled, the signal held by the latch L4 is inhibited from being updated. The switch SW4 selects one of the output signal of the latch L4 and the output signal of the delay circuit 4D in response to the second control signal fed from the provisional determination circuit 8L. The switch SW4 transmits the selected signal to the multiplier 8E.

The latch L5 periodically samples and holds the output signal of the delay circuit 4E in response to the system clock signal. The latch L5 is selectively enabled and disabled in response to the first control signal fed from the provisional determination circuit 8L. The latch L5 is enabled when the first control signal is "1". The latch L5 is disabled when the first control signal is "0". The latch L5 serves as a 1-sample delay circuit when being enabled. When the latch L5 is disabled, the signal held by the latch L5 is inhibited from being updated. The switch SW5 selects one of the output signal of the latch L5 and the output signal of the delay circuit 4E in response to the second control signal fed from the provisional determination circuit 8L. The switch SW5 transmits the selected signal to the multiplier 8F.

Figure 10:
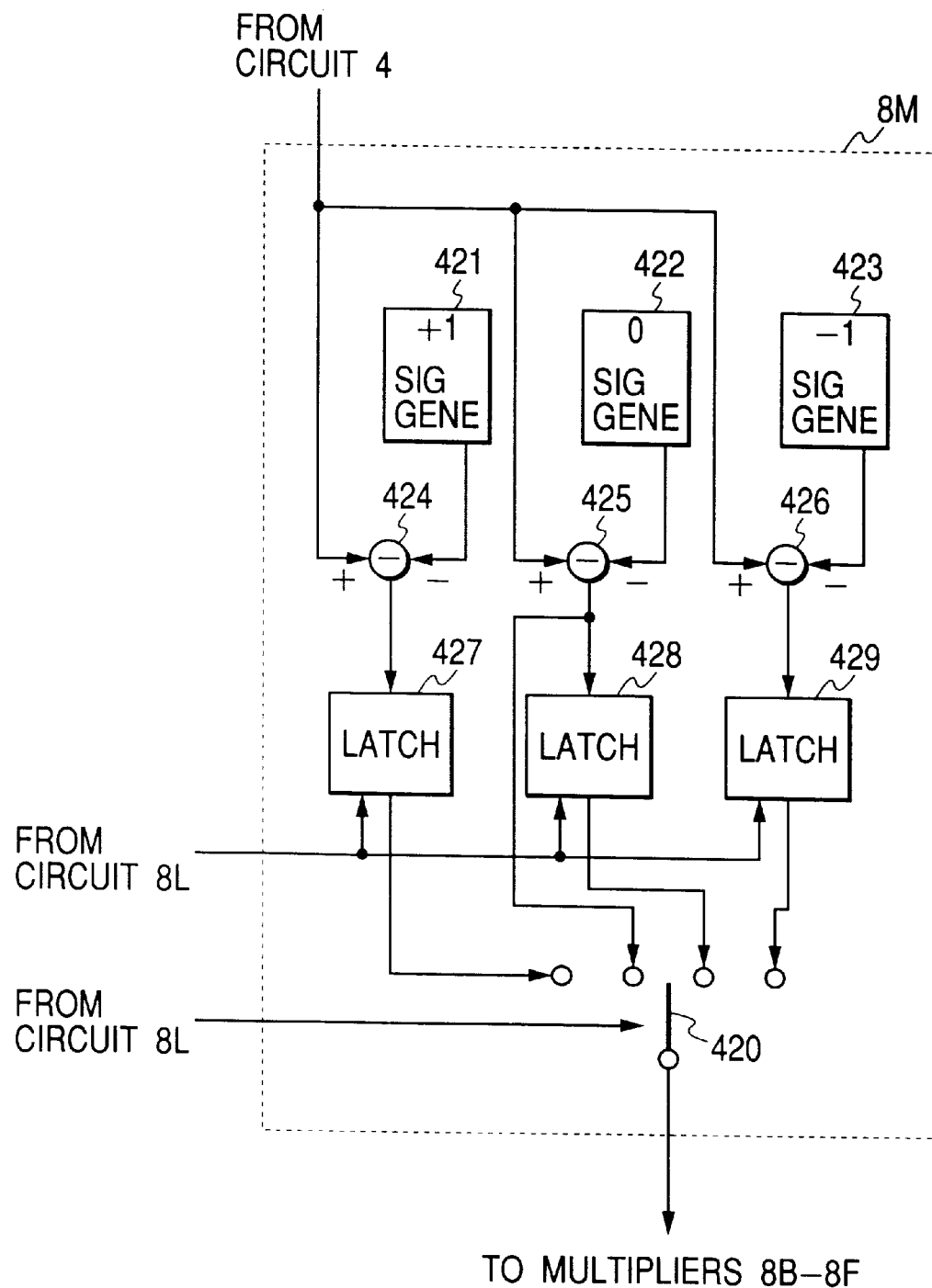
FIG. 10 is a block diagram of an error calculation circuit in FIG. 8.

As shown in FIG. 10, the error calculation circuit 8M includes a switch 420, signal generators 421, 422, and 423, subtracters 424, 425, and 426, and latches 427, 428, and 429. First input terminals of the subtracters 424, 425, and 426 are connected to the output terminal of the adder 4K within the waveform equalization circuit 4. Second input terminal of the subtracters 424, 425, and 426 are connected to the output terminals of the signal generators 421, 422, and 423, respectively. The output terminal of the subtracter 424 is connected to the input terminal of the latch 427. The output terminal of the latch 427 is connected to a first fixed contact of the switch 420. The output terminal of the subtracter 425 is connected to the input terminal of the latch 428 and also a second fixed contact of the switch 420. The output terminal of the latch 428 is connected to a third fixed contact of the switch 420. The output terminal of the subtracter 426 is connected to the input terminal of the latch 429. The output terminal of the latch 429 is connected to a fourth fixed contact of the switch 420. The latches 427, 428, and 429 have enabling terminals connected to the first output terminal of the provisional determination circuit 8L. The switch 420 has a control terminal. The switch 420 also has a movable contact which connects with one of the first, second, third, and fourth fixed contacts in response to a signal applied to the control terminal thereof. The control terminal of the switch 420 is connected to the third output terminal of the provisional determination circuit 8L.

The signal generator 421 produces a signal corresponding to a predetermined ideal level of "+1". The signal generator 421 outputs the "+1" level signal to the subtracter 424. The subtracter 424 receives the waveform-equalization-resultant signal, that is, the output signal of the adder 4K within the waveform equalization circuit 4. The subtracter 424 generates and outputs a signal corresponding to the waveform-equalization-resultant signal minus the "+1" level signal, that is, corresponding to the amplitude error (the difference) between the waveform-equalization-resultant signal and the "+1" level signal. The latch 427 periodically samples and holds the output signal of the subtracter 424 in response to the system clock signal. The latch 427 outputs the held signal to the first fixed contact of the switch 420. The latch 427 receives the first control signal from the provisional determination circuit 8L as an enabling signal. The latch 427 is selectively enabled and disabled in response to the enabling signal fed from the provisional determination circuit 8L. The latch 427 is enabled when the enabling signal is "1". The latch 427 is disabled when the enabling signal is "0". The latch 427 serves as a 1-sample delay circuit when being enabled. When the latch 427 is disabled, the signal held by the latch 427 is inhibited from being updated.

The signal generator 422 produces a signal corresponding to a predetermined ideal level of "0". The signal generator 422 outputs the "0" level signal to the subtracter 425. The subtracter 425 receives the waveform-equalization-resultant signal, that is, the output signal of the adder 4K within the waveform equalization circuit 4. The subtracter 425 generates and outputs a signal corresponding to the waveformn-equalization-resultant signal minus the "0" level signal, that is, corresponding to the amplitude error (the difference) between the waveform-equalization-resultant signal and the "0" level signal. The output signal of the subtracter 425 is applied to the latch 428 and also the second fixed contact of the switch 420. The latch 428 periodically samples and holds the output signal of the subtracter 425 in response to the system clock signal. The latch 428 outputs the held signal to the third fixed contact of the switch 420. The latch 428 receives the first control signal from the provisional determination circuit 8L as an enabling signal. The latch 428 is selectively enabled and disabled in response to the enabling signal fed from the provisional determination circuit 8L. The latch 428 is enabled when the enabling signal is "1". The latch 428 is disabled when the enabling signal is "0". The latch 428 serves as a 1-sample delay circuit when being enabled. When the latch 428 is disabled, the signal held by the latch 428 is inhibited from being updated.

The signal generator 423 produces a signal corresponding to a predetermined ideal level of "−1". The signal generator 423 outputs the "−1" level signal to the subtracter 426. The subtracter 426 receives the waveform-equalization-resultant signal, that is, the output signal of the adder 4K within the waveform equalization circuit 4. The subtracter 426 generates and outputs a signal corresponding to the waveform-equalization-resultant signal minus the "−1" level signal, that is, corresponding to the amplitude error (the difference) between the waveform-equalization-resultant signal and the "−1" level signal. The latch 429 periodically samples and holds the output signal of the subtracter 426 in response to the system clock signal. The latch 429 outputs the held signal to the fourth fixed contact of the switch 420. The latch 429 receives the first control signal from the provisional determination circuit 8L as an enabling signal. The latch 429 is selectively enabled and disabled in response to the enabling signal fed from the provisional determination circuit 8L. The latch 429 is enabled when the enabling signal is "1". The latch 429 is disabled when the enabling signal is "0". The latch 429 serves as a 1-sample delay circuit when being enabled. When the latch 429 is disabled, the signal held by the latch 429 is inhibited from being updated.

The movable contact of the switch 420 connects with one of the first, second, third, and fourth fixed contacts thereof in response to the third control signal (the switch control signal) outputted from the provisional determination circuit 8L. Thus, the switch 420 selects one of the output signals of the devices 425, 427, 428, and 429 in response to the switch control signal. The switch 420 transmits the selected signal to the multipliers 8B, 8C, 8D, 8E, and 8F as an amplitude error signal.

The operation of the provisional determination circuit 8L and also the operation of the error calculation circuit 8M will be further explained. The provisional determination circuit 8L generates the control signal for the switch 420 within the error calculation circuit 8M. The control signal for the switch 420 can be changed among four different states. The first state of the control signal corresponds to a condition where at the present sampling moment, the level of a signal sample at a sampling moment immediately preceding the present sampling moment is decided to be "+1". In this case, the switch 420 is controlled to select the output signal of the latch 427. The second state of the control signal corresponds to a condition where at the present sampling moment, the level of a signal sample at a sampling moment immediately preceding the present sampling moment is decided to be "0". In this case, the switch 420 is controlled to select the output signal of the latch 428. The third state of the control signal corresponds to a condition where at the present sampling moment, the level of a signal sample at a sampling moment immediately preceding the present sampling moment is decided to be "−1". In this case, the switch 420 is controlled to select the output signal of the latch 429. The fourth state of the control signal corresponds to a condition where at the present sampling moment, the level of a signal sample at a sampling moment immediately preceding the present sampling moment remains undecided while the level of a signal sample at the present sampling moment is decided to be "0". In this case, the switch 420 is controlled to select the output signal of the subtracter 425.

With reference to FIG. 7, at the moment (1), the level of the present signal sample is undecided. It is expected that the level of the present signal sample is "0" or "+1". At the moment (2), the level of the present signal sample exceeds the reference value in the negative direction so that the level of the signal sample at the moment (1) is decided to be "+1". At this time, the switch 420 selects the output signal of the latch 427 in response to the switch control signal outputted from the provisional determination circuit 8L.

If the level of the present signal sample does not exceed the reference level in the negative direction and is close to "0" at the moment (2), the level of the signal sample at the moment (1) remains undecided while the level of the present signal sample is decided to be "0". In this case, the switch 420 selects the output signal of the subtracter 425 in response to the switch control signal outputted from the provisional determination circuit 8L.

If the level of the present signal sample does not exceed the reference level in the negative direction and is close to "+1" at the moment (2), the level of the signal sample at the moment (1) is decided to be "0". In this case, the switch 420 selects the output signal of the latch 428 in response to the switch control signal outputted from the provisional determination circuit 8L.

In the case where the level of a signal sample at a sampling moment immediately preceding the present sampling moment is decided to be "−1", the switch 420 selects the output signal of the latch 429 in response to the switch control signal outputted from the provisional determination circuit 8L.

The operation of the provisional determination circuit 8L and also the operation of the holding and selecting circuit 8A will be further explained. The provisional determination circuit 8L generates the control signal for the switches SW1, SW2, SW3, SW4, and SW5 within the holding and selecting circuit 8A. The control signal for the switches SW1, SW2, SW3, SW4, and SW5 can be changed between two different states. The first state of the control signal corresponds to a condition where at the present sampling moment, the level of a signal sample at a sampling moment immediately preceding the present sampling moment is decided to be "+1", "0", or "−1". In this case, the switches SW1, SW2, SW3, SW4, and SW5 are controlled to select the output signals of the latches L1, L2, L3, L4, and L5. Thus, when the switch 420 selects one of the output signals of the latches 427, 428, and 429 in the error calculation circuit 8M, the switches SW1, SW2, SW3, SW4, and SW5 select the output signals of the latches L1, L2, L3, L4, and L5. The second state of the control signal corresponds to a condition where at the present sampling moment, the level of a signal sample at a sampling moment immediately preceding the present sampling moment remains undecided while the level of a signal sample at the present sampling moment is decided to be "0". In this case, the switches SW1, SW2, SW3, SW4, and SW5 are controlled to select the output signals of the devices 4A, 4B, 4C, 4D, and 4E. Thus, when the switch 420 selects the output signal of the subtracter 425 in the error calculation circuit 8M, the switches SW1, SW2, SW3, SW4, and SW5 select the output signals of the devices 4A, 4B, 4C, 4D, and 4E.

In the control circuit 8 of FIG. 8, the devices 8B, 8C, 8D, 8E, and 8F multiply the respective output signals of the holding and selecting circuit 8A by the amplitude error signal fed from the error calculation circuit 8M. The multipliers 8B, 8C, 8D, 8E, and 8F output the multiplication-resultant signals to the low pass filters 8G, 8H, 8I, 8J, and 8K, respectively. The low pass filters 8G, 8H, 8I, 8J, and 8K process the output signals of the multipliers 8B, 8C, 8D, 8E, and 8F into signals representing the tap coefficients, respectively. The low pass filters 8G, 8H, 8I, 8J, and 8K output the tap coefficient signals to the multipliers 4F, 4G, 4H, 4I, and 4J within the waveform equalization circuit 4, respectively.

Figure 11:
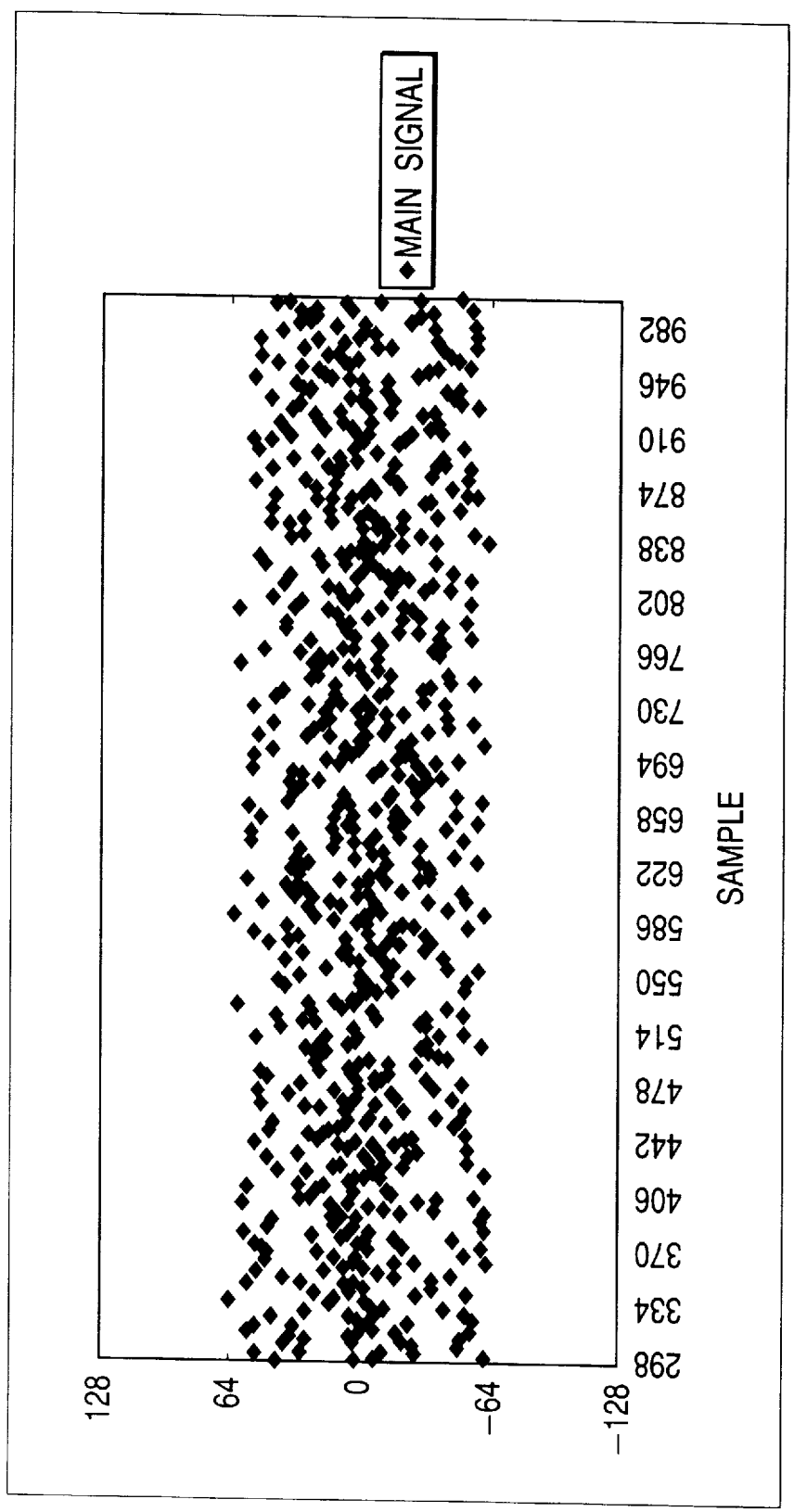
FIG. 11 is a time-domain diagram of signal samples.
Figure 12:
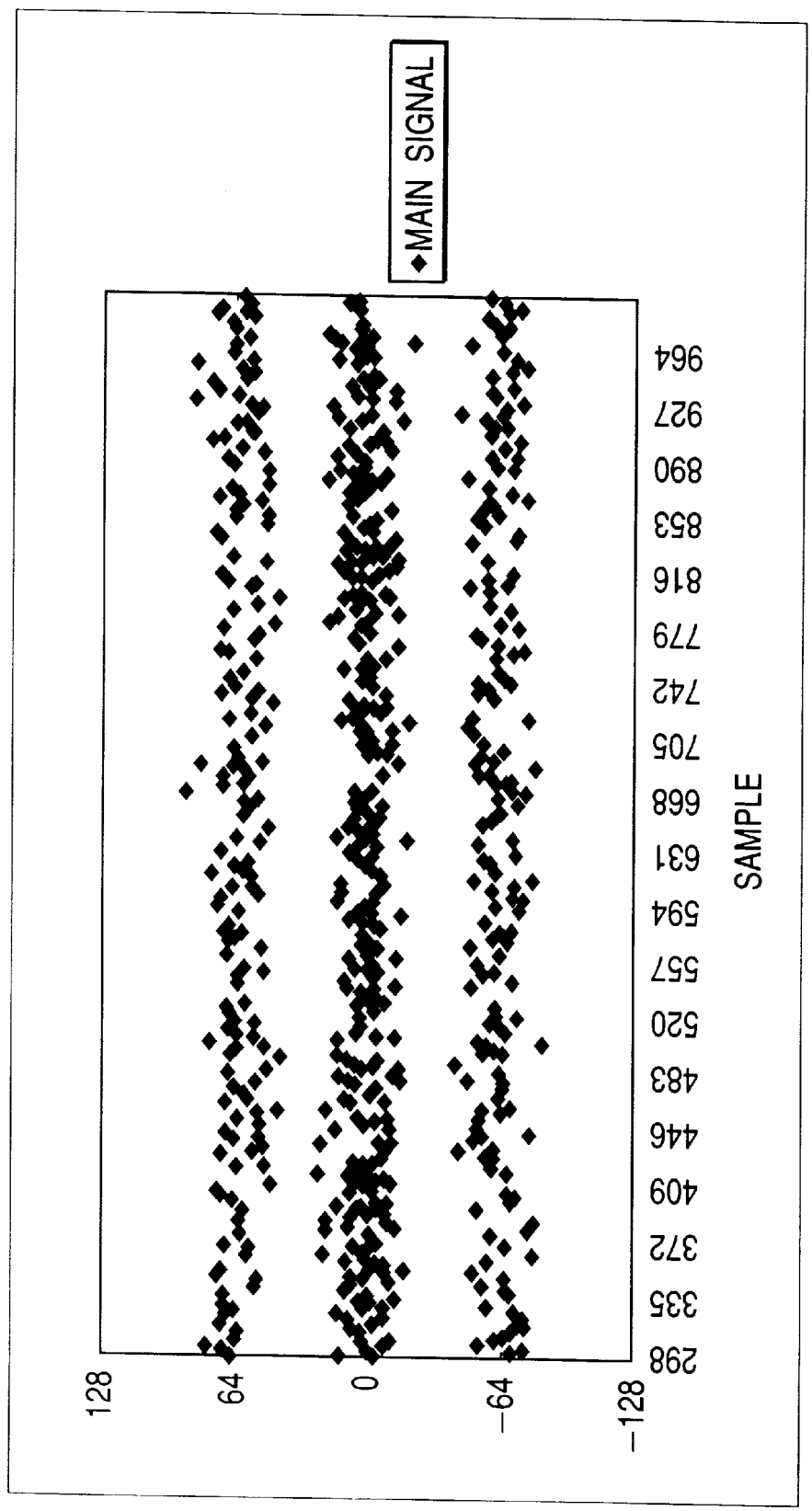
FIG. 12 is a time-domain diagram of signal samples which result from processing the signal samples in FIG. 11 by the automatic equalization system of FIG. 2.

Experiments were carried out. During the experiments, an analog signal representing a digital information signal which had conditions shown in FIG. 11 was inputted into the automatic equalization system of FIG. 2. In FIG. 11, the abscissa denotes sampling moments arranged in time domain, and the ordinate denotes the levels of signal samples. The input analog signal was processed by the automatic equalization system of FIG. 2 into a waveform-equalization-resultant signal which appeared at the output terminal of the waveform equalization circuit 4. FIG. 12 shows conditions of the waveform-equalization-resultant signal. In FIG. 12, the abscissa denotes sampling moments arranged in time domain, and the ordinate denotes the levels of signal samples. As shown in FIG. 12, samples of the waveform-equalization-resultant signal converged on three different levels corresponding to "+1", "0", and "−1".

Figure 18:
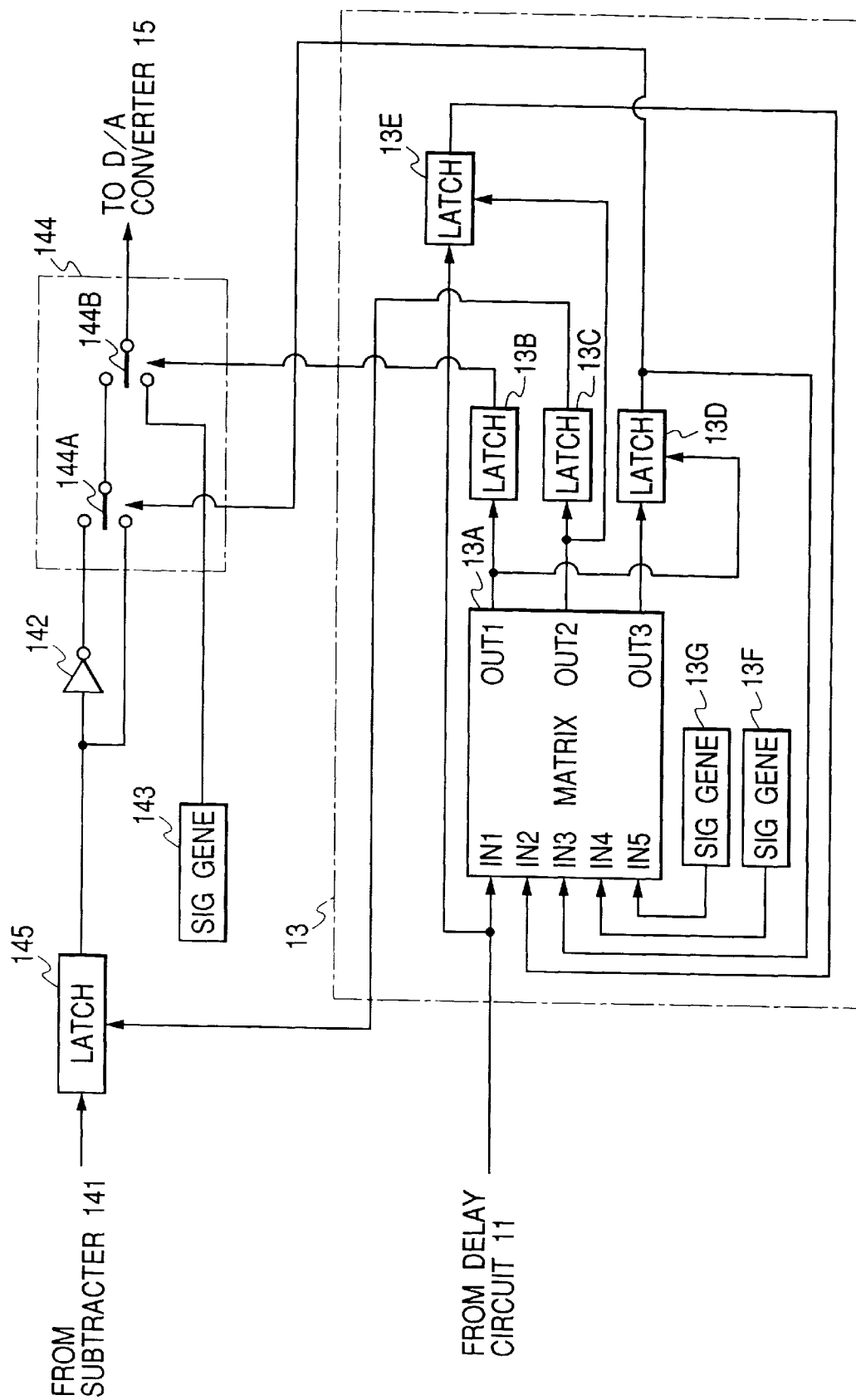
FIG. 18 is a block diagram of an example of a provisional determination circuit in FIG. 3.

FIG. 18 shows an example of the provisional determination circuit 13 in FIG. 3. The provisional determination circuit 13 of FIG. 18 includes a matrix circuit 13A, latches 13B, 13C, 13D, and 13E, and signal generators 13F and 13G. The matrix circuit 13A has input terminals IN1, IN2, IN3, IN4, and IN5, and output terminals OUT1, OUT2, and OUT3. The input terminal IN1 of the matrix circuit 13A is connected to the output terminal of the delay circuit 11. Also, the input terminal of the latch 13E is connected to the output terminal of the delay circuit 11. The input terminals IN4 and IN5 of the matrix circuit 13A are connected to the output terminals of the signal generators 13F and 13G, respectively. The output terminals OUT1, OUT2, and OUT3 of the matrix circuit 13A are connected to the input terminals of the latches 13B, 13C, and 13D, respectively.

As shown in FIG. 18, the switch 144 includes first and second sub switches 144A and 144B. The output terminal of the latch 13B is connected to a control terminal of the sub switch 144B. The output terminal of the latch 13C is connected to the enabling terminal of the latch 145. The output terminal of the latch 13D is connected to the input terminal IN3 of the matrix circuit 13A and a control terminal of the sub switch 144A. The latch 13D has an enabling terminal connected to the output terminal OUT1 of the matrix circuit 13A. The output terminal of the latch 13E is connected to the input terminal IN2 of the matrix circuit 13A. The latch 13E has an enabling terminal connected to the output terminal OUT2 of the matrix circuit 13A.

The signal generator 13F outputs a signal to the input terminal IN4 of the matrix circuit 13A which represents a predetermined positive threshold value (a positive reference value) TH. The signal generator 13G outputs a signal to the input terminal IN5 of the matrix circuit 13A which represents a predetermined negative threshold value (a negative reference value) −TH.

Now, the character "in1" denotes the value represented by the signal applied to the input terminal IN1 of the matrix circuit 13A, that is, the output signal of the delay circuit 11. The character "in2" denotes the value represented by the signal applied to the input terminal IN2 of the matrix circuit 13A, that is, the output signal of the latch 13E. The character "in3" denotes the logic state of the signal applied to the input terminal IN3 of the matrix circuit 13A, that is, the output signal of the latch 13D. The character "out1" denotes the logic state of a signal which appears at the output terminal OUT1 of the matrix circuit 13A. The character "out2" denotes the logic state of a signal which appears at the output terminal OUT2 of the matrix circuit 13A. The character "out3" denotes the logic state of a signal which appears at the output terminal OUT3 of the matrix circuit 13A.

The matrix circuit 13A is designed to provide the following relation among signals inputted thereto and signals outputted therefrom. In the case where "in3" is "1" and "in1"<"in2", "out1" is "0" and "out2" is "1", and "out3" is "Qn−1" indicating a logic state equal to that available in the immediately-preceding sample interval. In the case where "in3" is "1" and "in1">"in2"+TH, "out1" is "1" and "out2" is "1", and "out3" is "0". In the case where "in3" is "1" and "in2"≦"in1"≦"in2"+TH, "out1" is "0" and "out2" is "0", and "out3" is "Qn−1". In the case where "in3" is "0" and "in1">"in2", "out1" is "0" and "out2" is "1", and "out3" is "Qn−1". In the case where "in3" is "0" and "in1"<"in2"−TH, "out1" is "1" and "out2" is "1", and "out3" is "1". In the case where "in3" is "0" and "in2"≧"in1"≧"in2"−TH, "out1" is "0" and "out2" is "0", and "out3" is "Qn−1".

The latch 13B receives the signal from the output terminal OUT1 of the matrix circuit 13A, and periodically samples and holds the received signal in response to the system clock signal. The latch 13B serves as a 1-sample delay circuit. The output signal from the latch 13B is applied to the control terminal of the sub switch 144B.

The latch 13C receives the signal from the output terminal OUT2 of the matrix circuit 13A, and periodically samples and holds the received signal in response to the system clock signal. The latch 13C serves as a 1-sample delay circuit. The output signal from the latch 13C is applied to the enabling terminal of the latch 145.

The latch 13D receives the signal from the output terminal OUT3 of the matrix circuit 13A, and periodically samples and holds the received signal in response to the system clock signal. The latch 13D receives the signal from the output terminal OUT1 of the matrix circuit 13A as an enabling signal. The latch 13D is selectively enabled and disabled in response to the enabling signal. In general, the latch 13D is enabled when the enabling signal is "1". The latch 13D is disabled when the enabling signal is "0". The latch 13D serves as a 1-sample delay circuit when being enabled. When the latch 13D is disabled, the signal held by the latch 13D is inhibited from being updated. The output signal of the latch 13D is applied to the control terminal of the sub switch 144A and also the input terminal IN3 of the matrix circuit 13A.

The latch 13E receives the output signal of the delay circuit 11, and periodically samples and holds the received signal in response to the system clock signal. The latch 13E receives the signal from the output terminal OUT2 of the matrix circuit 13A as an enabling signal. The latch 13E is selectively enabled and disabled in response to the enabling signal. In general, the latch 13E is enabled when the enabling signal is "1". The latch 13E is disabled when the enabling signal is "0". The latch 13E serves as a 1-sample delay circuit when being enabled. When the latch 13E is disabled, the signal held by the latch 13E is inhibited from being updated. The output signal of the latch 13E is applied to the input terminal IN2 of the matrix circuit 13A.

Input sides of the sub switch 144A are connected to the output terminals of the inverter 142 and the latch 145, respectively. The output side of the sub switch 144A is connected to an input side of the sub switch 144B. Another input side of the sub switch 144B is connected to the output terminal of the signal generator 143. The sub switch 144A selects one of the output signal of the inverter 142 and the output signal of the latch 145 in response to the output signal of the latch 13D. Specifically, the sub switch 144A selects the output signal of the inverter 142 when the output signal of the latch 13D is "1". The sub switch 144A selects the output signal of the latch 145 when the output signal of the latch 13D is "0". The sub switch 144A transmits the selected signal to the sub switch 144B. The sub switch 144B selects one of the output signal of the sub switch 144A and the output signal of the signal generator 143 in response to the output signal of the latch 13B. Specifically, the sub switch 144B selects the output signal of the sub switch 144A when the output signal of the latch 13B is "1". The sub switch 144B selects the output signal of the signal generator 143 when the output signal of the latch 13B is "0". The sub switch 144B transmits the selected signal to the D/A converter 15.

Figure 19:
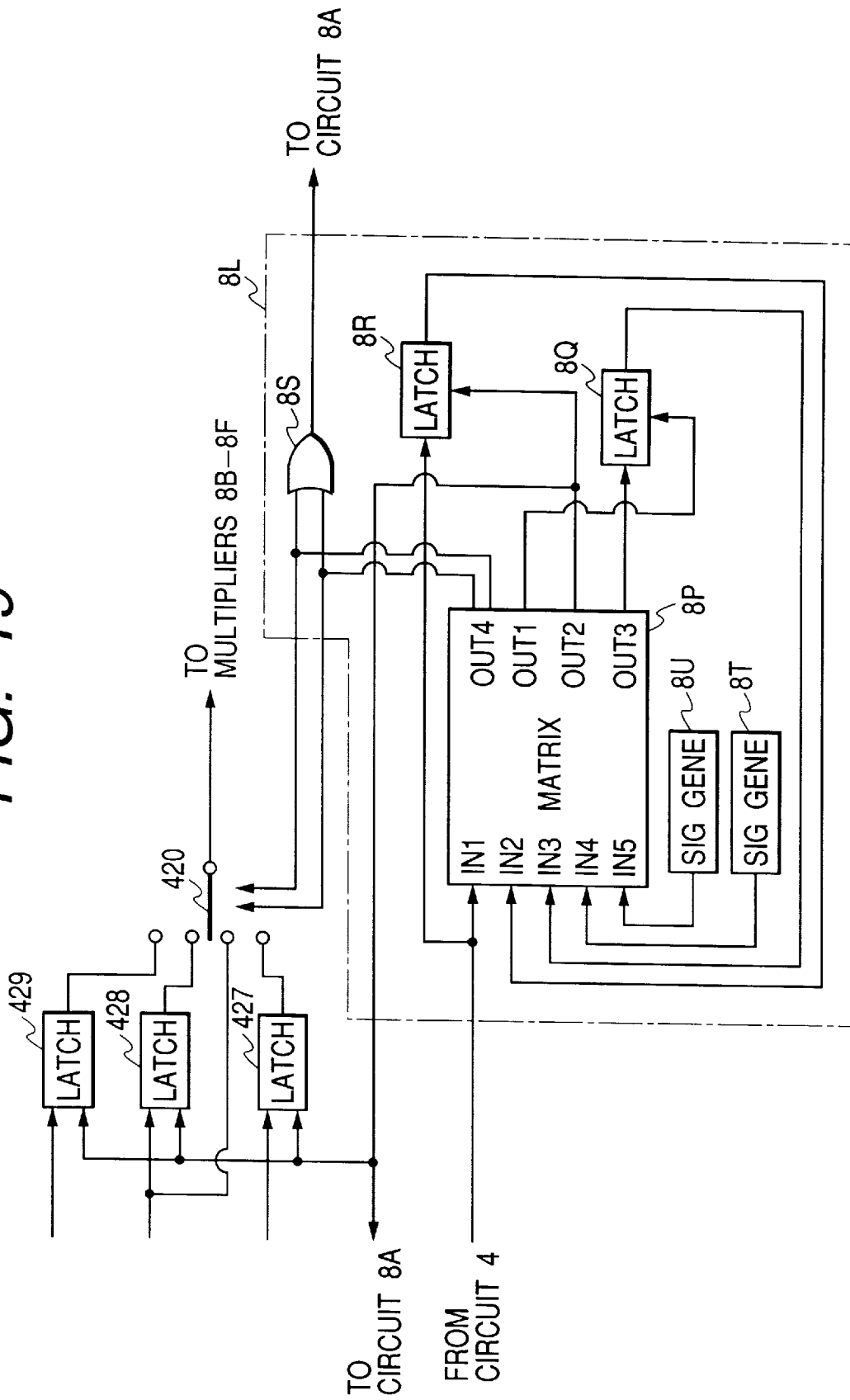
FIG. 19 is a block diagram of an example of a provisional determination circuit in FIG. 8.

FIG. 19 shows an example of the provisional determination circuit 8L in FIG. 8. The provisional determination circuit 8L of FIG. 19 includes a matrix circuit 8P, latches 8Q and 8R, an OR gate 8S, and signal generators 8T and 8U. The matrix circuit 8P has input terminals IN1, IN2, IN3, IN4, and IN5, and output terminals OUTl, OUT2, OUT3, and OUT4. The input terminal IN1 of the matrix circuit 8P is connected to the output terminal of the waveform equalization circuit 4. Also, the input terminal of the latch 8R is connected to the output terminal of the waveform equalization circuit 4. The input terminals IN4 and INS of the matrix circuit 8P are connected to the output terminals of the signal generators 8T and 8U, respectively. The output terminal OUTL of the matrix circuit 8P is connected to an enabling terminal of the latch 8Q. The output terminal OUT2 of the matrix circuit 8P is connected to an enabling terminal of the latch 8R and also enabling terminals of the latches 427, 428, and 429. Furthermore, the output terminal OUT2 of the matrix circuit 8P is connected to the enabling terminals of the latches L1-L5 within the holding and selecting circuit 8A. The output terminal OUT3 of the matrix circuit 8P is connected to the input terminal of the latch 8Q. The output terminal of the latch 8Q is connected to the input terminal IN3 of the matrix circuit 8P. The output terminal of the latch 8R is connected to the input terminal IN2 of the matrix circuit 8P.

The output terminal OUT4 of the matrix circuit 8P has two bits connected to the control terminal of the switch 420. The two bits of the output terminal OUT4 of the matrix circuit 8P are connected to two input terminals of the OR gate 8S, respectively. The output terminal of the OR gate 8S is connected to the control terminals of the switches SW1-SW5 within the holding and selecting circuit 8A.

The signal generator 8T outputs a signal to the input terminal IN4 of the matrix circuit 8P which represents a predetermined positive threshold value (a positive reference value) TH. The signal generator 8U outputs a signal to the input terminal IN5 of the matrix circuit 8P which represents a predetermined negative threshold value (a negative reference value) –TH.

Now, the character "in1" denotes the value represented by the signal applied to the input terminal IN1 of the matrix circuit 8P, that is, the output signal of the waveform equalization circuit 4. The character "in2" denotes the value represented by the signal applied to the input terminal IN2 of the matrix circuit 8P, that is, the output signal of the latch 8R. The character "in3" denotes the logic state of the signal applied to the input terminal IN3 of the matrix circuit 8P, that is, the output signal of the latch 8Q. The character "out1" denotes the logic state of a signal which appears at the output terminal OUT1 of the matrix circuit 8P. The character "out2" denotes the logic state of a signal which appears at the output terminal OUT2 of the matrix circuit 8P. The character "out3" denotes the logic state of a signal which appears at the output terminal OUT3 of the matrix circuit 8P. The character "out4" denotes the logic state of a signal which appears at the output terminal OUT4 of the matrix circuit 8P.

The matrix circuit 8P is designed to provide the following relation among signals inputted thereto and signals outputted therefrom. In the case where "in3" is "1" and "in1"<"in2", "out1" is "0" and "out2" is "1", and "out4" is "10" and "out3" is "Qn–1" indicating a logic state equal to that available in the immediately-preceding sample interval. In the case where "in3" is "1" and "in1">"in2"+TH, "out1" is "1" and "out2" is "1", and "out4" is 11 and "out3" is "0". In the case where "in3" is "1" and "in2"≦"in1"≦"in2"+TH, "out1" is "0" and "out2" is "0", and "out4" is "00" and "out3" is "Qn–1". In the case where "in3" is "0" and "in1">"in2", "out1"is "0" and "out2" is "1", and "out4" is "10" and "out3" is "Qn–1". In the case where "in3" is "0" and "in1"<"in2"–TH, "out1" is "1" and "out2" is "1", and "out4" is "01" and "out3" is "1". In the case where "in3" is "0" and "in2"≧"in1"≧"in2"–TH, "out1" is "0" and "out2" is "0", and "out4" is "00" and "out3" is "Qn–1".

The latch 8Q receives the signal from the output terminal OUT3 of the matrix circuit 8P, and periodically samples and holds the received signal in response to the system clock signal. The latch 8Q receives the signal from the output terminal OUT1 of the matrix circuit 8P as an enabling signal. The latch 8Q is selectively enabled and disabled in response to the enabling signal. In general, the latch 8Q is enabled when the enabling signal is "1". The latch 8Q is disabled when the enabling signal is "0". The latch 8Q serves as a 1-sample delay circuit when being enabled. When the latch 8Q is disabled, the signal held by the latch 8Q is inhibited from being updated. The output signal of the latch 8Q is applied to the input terminal IN3 of the matrix circuit 8P.

The latch 8R receives the output signal of the waveform equalization circuit 4, and periodically samples and holds the received signal in response to the system clock signal. The latch 8R receives the signal from the output terminal OUT2 of the matrix circuit 8P as an enabling signal. The latch 8R is selectively enabled and disabled in response to the enabling signal. In general, the latch 8R is enabled when the enabling signal is "1". The latch 8R is disabled when the enabling signal is "0". The latch 8R serves as a 1-sample delay circuit when being enabled. When the latch 8R is disabled, the signal held by the latch 8R is inhibited from being updated. The output signal of the latch 8R is applied to the input terminal IN2 of the matrix circuit 8P.

The signal from the output terminal OUT2 of the matrix circuit 8P is fed to the latches 427, 428, and 429 as an enabling signal. Also, the signal from the output terminal OUT2 of the matrix circuit 8P is fed to the latches L1–L5 within the holding and selecting circuit 8A.

The signal from the output terminal OUT4 of the matrix circuit 8P is fed to the switch 420 as a switch control signal. When the switch control signal is "01", the switch 420 is controlled to select the output signal of the latch 429. When the switch control signal is "10", the switch 420 is controlled to select the output signal of the latch 428. When the switch control signal is "11", the switch 420 is controlled to select the output signal of the latch 427. When the switch control signal is "00", the switch 420 is controlled to select the output signal of the subtracter 425 (see FIG. 10).

The two bits of the signal from the output terminal OUT4 of the matrix circuit 8P are applied to the input terminals of the OR gate 8S, respectively. The device 8S implements OR operation between the two bits of the signal from the output terminal OUT4 of the matrix circuit 8P. The OR gate 8S outputs the resultant signal to the control terminals of the switches SW1–SW5 within the holding and selecting circuit 8A. When the output signal of the OR gate 8S is "1", the switches SW1–SW5 select the output signals of the latches L1–L5. When the output signal of the OR gate 8S is "0", the switches SW1–SW5 select the output signals of the devices 4A–4E.

Second Embodiment

Figure 13:
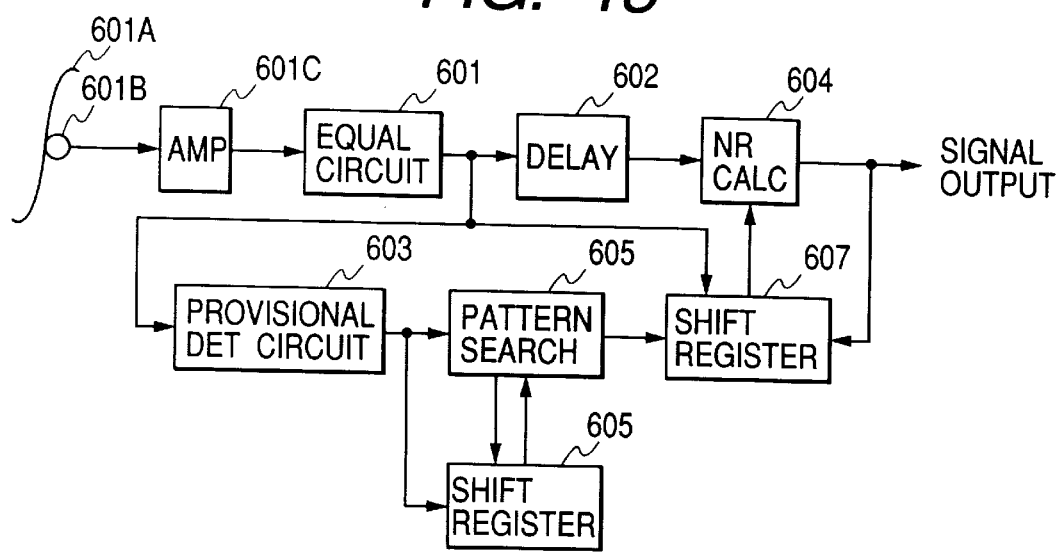
FIG. 13 is a block diagram of a noise reduction circuit according to a second embodiment of this invention.

FIG. 13 shows a noise reduction circuit according to a second embodiment of this invention. The noise reduction circuit of FIG. 13 includes an equalization circuit 601, a delay circuit 602, a provisional determination circuit 603, an NR calculation circuit 604, a pattern search circuit 605, and shift registers 606 and 607.

The input terminal of the equalization circuit 601 is connected to a magnetic head 601B via a preamplifier 601C. The magnetic head 601B scans a magnetic tape 601A. It should be noted that a low pass filter may be provided between the preamplifier 601C and the equalization circuit 601. The output terminal of the equalization circuit 601 is connected to the input terminal of the delay circuit 602 and also the input terminal of the provisional determination circuit 603. In addition, the output terminal of the equalization circuit 601 is connected to the shift register 607. The output terminal of the delay circuit 602 is connected to a first input terminal of the NR calculation circuit 604. A second input terminal of the NR calculation circuit 604 is connected to the shift register 607. The output terminal of the NR calculation circuit 604 is connected to the shift register 607. Also, the output terminal of the NR calculation circuit 604 is connected to an external device (not shown) such as a viterbi circuit. The output terminal of the provisional determination circuit 603 is connected to the pattern search circuit 605 and the shift register 606. The pattern search circuit 605 is connected to the shift registers 606 and 607.

The magnetic tape 601A stores a signal including a digital information signal (for example, a digital video/audio signal). The signal stored in the magnetic tape 601A conforms to a partial response format such as a PR(1, 0, –1) format. The magnetic head 601B reproduces the signal from the magnetic tape 601A. The reproduced signal is fed from the magnetic head 601B to the equalization circuit 601 via the preamplifier 601C as an input analog signal representing a digital information signal. It should be noted that a signal representing a digital information signal and being transmitted via a transmission line may be applied to the equalization circuit 601 as an input signal.

The input analog signal is subjected to equalization by the equalization circuit 601. The equalization circuit 601 is of a digital type. Thus, the equalization circuit 601 includes an analog-to-digital (A/D) converter which processes the input analog signal. The output signal of the equalization circuit 601, that is, the equalization-resultant signal, is fed to the delay circuit 602, the provisional determination circuit 603, and the shift register 607.

The provisional determination circuit 603 is similar to the provisional determination circuit 13 in FIGS. 3 and 18 or the provisional determination circuit 8L in FIGS. 8 and 19. The provisional determination circuit 603 decides whether the level of every sample of the output signal of the equalization circuit 601 corresponds to "1", "0", or "−1". When the level of a sample of the output signal of the equalization circuit 601 corresponds to "1", the provisional determination circuit 603 outputs a predetermined ideal "1" signal to the pattern search circuit 605 and the shift register 606. When the level of a sample of the output signal of the equalization circuit 601 corresponds to "0", the provisional determination circuit 603 outputs a predetermined ideal "0" signal to the pattern search circuit 605 and the shift register 606. When the level of a sample of the output signal of the equalization circuit 601 corresponds to "−1", the provisional determination circuit 603 outputs a predetermined ideal "−1" signal to the pattern search circuit 605 and the shift register 606.

The shift register 606 stores a first predetermined number of successive samples (bits or 1-bit-corresponding segments) of the output signal from the provisional determination circuit 603. The pattern search circuit 605 includes a shift register which stores a second predetermined number of successive samples (bits or 1-bit-corresponding segments) of the output signal from the provisional determination circuit 603. The second predetermined number is significantly smaller than the first predetermined number. The pattern of bits stored in the shift register within the pattern search circuit 605 is referred to as the current bit pattern. The pattern search circuit 605 includes a comparator which implements a pattern comparing process to search the bit sequence in the shift register 606 for a past bit pattern equal to or correlating to the current bit pattern. When the pattern search circuit 605 finds such a past bit pattern in the shift register 606, the pattern search circuit 605 outputs a pattern match signal to the shift register 607. The pattern match signal represents the address (the position) of a temporally central signal sample among the signal samples representing the previously-indicated past bit pattern in the shift register 606.

The shift register 607 stores the first predetermined number of successive samples (bits or 1-bit-corresponding segments) of the output signal from the equalization circuit 601. The signal samples in the shift register 607 correspond in time position and address to the signal samples in the shift register 606. To provide this timing agreement, a delay circuit may be provided between the equalization circuit 601 and the shift register 607. As will explained later, each signal sample in the shift register 607 is replaced by a correction-resultant signal sample. When the shift register 607 receives the pattern match signal from the pattern search circuit 605, a signal sample corresponding to the address represented by the pattern match signal is read out from the shift register 607 and is fed to the NR calculation circuit 604. In the absence of the pattern match signal fed to the shift register 607, the latest signal sample is transmitted from the shift register 607 to the NR calculation circuit 604.

The delay circuit 602 defers the output signal of the equalization circuit 601 by a time corresponding to the signal delay caused by the combination of the devices 603, 605, 606, and 607. The delay circuit 602 outputs the deferred signal to the NR calculation circuit 604. The delay circuit 602 provides a timing agreement between a signal sample fed to the NR calculation circuit 604 from the delay circuit 602 and a signal sample fed to the NR calculation circuit 604 from the shift register 607.

Figure 14:
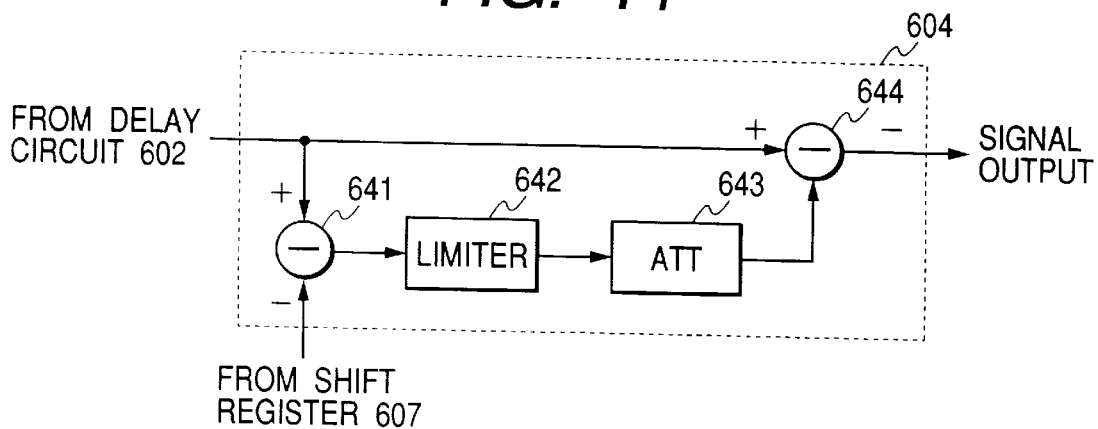
FIG. 14 is a block diagram of an NR calculation circuit in FIG. 13.

As shown in FIG. 14, the NR calculation circuit 604 includes a subtracter 641, a limiter 642, an attenuator 643, and a subtracter 644. A first input terminal of the subtracter 641 is connected to the output terminal of the delay circuit 602. Also, a first input terminal of the subtracter 644 is connected to the output terminal of the delay circuit 602. A second input terminal of the subtracter 641 is connected to the shift register 607. The output terminal of the subtracter 641 is connected to the input terminal of the limiter 642. The output terminal of the limiter 642 is connected to the input terminal of the attenuator 643. The output terminal of the attenuator 643 is connected to a second input terminal of the subtracter 644. The output terminal of the subtracter 644 is connected to the shift register 607 and also the external device (not shown).

The subtracter 641 receives the output signal of the delay circuit 602. Also, the subtracter 641 receives the output signal of the shift register 607. The subtracter 641 generates and outputs a signal corresponding to the output signal of the delay circuit 602 minus the output signal of the shift register 607, that is, corresponding to the difference between the output signal of the delay circuit 602 and the output signal of the shift register 607. The output signal of the subtracter 641 represents noise components of the output signal of the delay circuit 602. The limiter 642 receives the output signal of the subtracter 641. The limiter 642 subjects the output signal of the subtracter 641 to processing which corresponds to limiting an amplitude to within-a given range. The limiter 642 outputs the resultant signal to the attenuator 643. The attenuator 643 subjects the output signal of the limiter 642 to processing which corresponds to attenuation at a given rate. The attenuator 643 outputs the attenuation-resultant signal to the subtracter 644 as a corrective signal. The subtracter 644 receives the output signal of the delay circuit 602. The subtracter 644 generates a correction-resultant signal which corresponds to the output signal of the delay circuit 602 minus the corrective signal fed from the attenuator 643, that is, which corresponds to the difference between the output signal of the delay circuit 602 and the corrective signal fed from the attenuator 643. Thereby, the subtracter 644 operates to reduce or suppress noise components of the output signal of the delay circuit 602. The correction-resultant signal is outputted from the subtracter 644 to the shift register 607 and the external device (not shown).

In the shift register 607, every signal sample of the output signal (the correction-resultant signal) of the subtracter 644 replaces a corresponding signal sample of the output signal of the equalization circuit 601. In other words, every signal sample of the output signal (the correction-resultant signal) of the subtracter 644 is written over a corresponding signal sample of the output signal of the equalization circuit 601 to implement updating.

Figure 15:
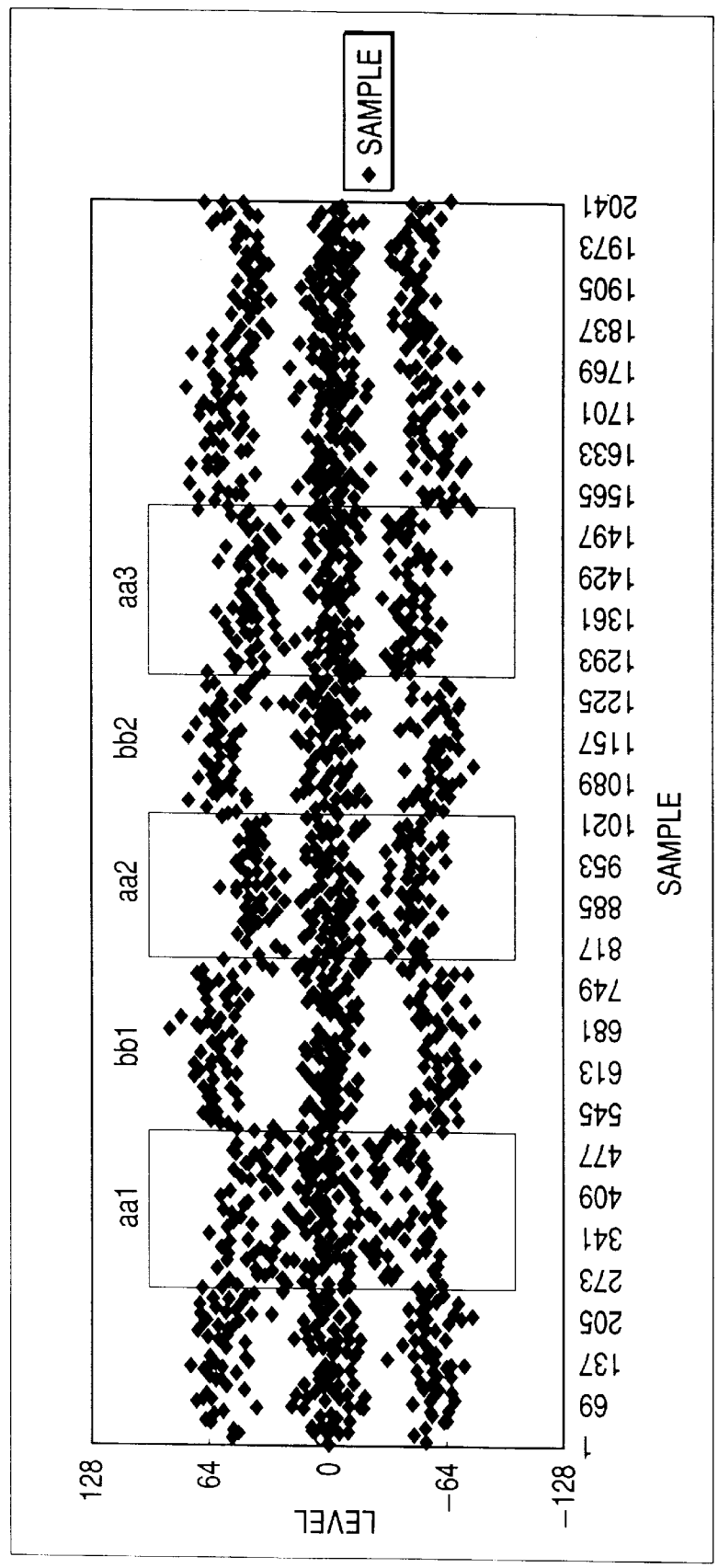
FIG. 15 is a time-domain diagram of signal samples.
Figure 16:
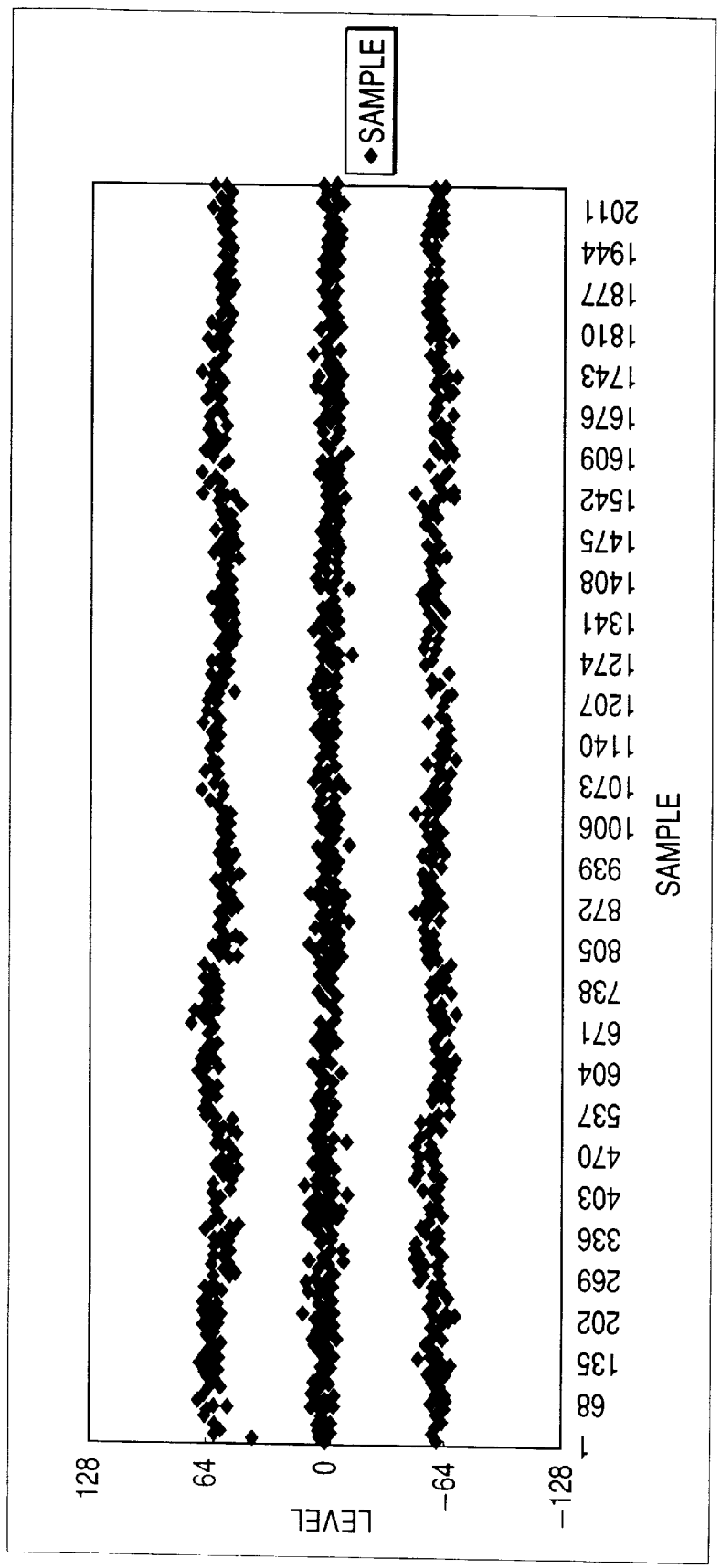
FIG. 16 is a time-domain diagram of signal samples which result from processing the signal samples in FIG. 15 by the noise reduction circuit of FIG. 13.

Experiments were carried out. During the experiments, an analog signal representing a digital information signal which had conditions shown in FIG. 15 was inputted into the noise reduction circuit of FIG. 13. In FIG. 15, the abscissa denotes sampling moments arranged in time domain, and the ordinate denotes the levels of signal samples. Under the conditions shown in FIG. 15, signal level separation was poor during intervals aa1, aa2, and aa3 while signal level separation was good during intervals bb1 and bb2. The input analog signal was processed by the noise reduction circuit of FIG. 13 into a correction-resultant signal which appeared at the output terminal of the NR calculation circuit 604. FIG. 16 shows conditions of the correction-resultant signal. In FIG. 16, the abscissa denotes sampling moments arranged in time domain, and the ordinate denotes the levels of signal samples. As shown in FIG. 16, samples of the correction-resultant signal converged on three different levels corresponding to "+1", "0", and "−1".

Third Embodiment

Figure 17:
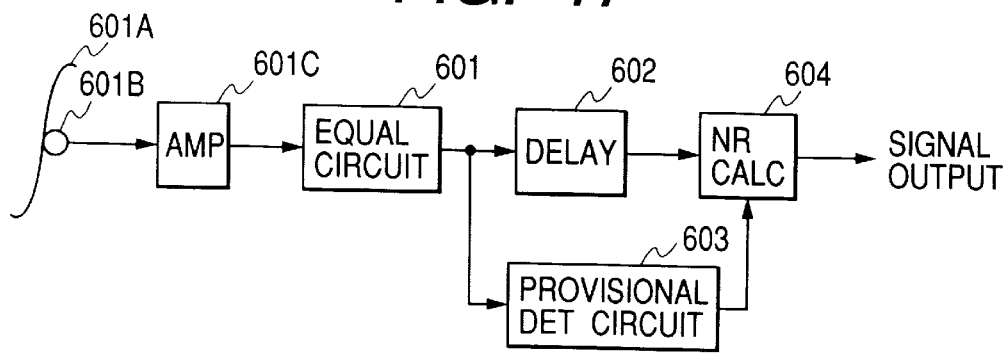
FIG. 17 is a block diagram of a noise reduction circuit according to a third embodiment of this invention.

FIG. 17 shows a noise reduction circuit according to a third embodiment of this invention. The noise reduction circuit of FIG. 17 is similar to the noise reduction circuit of FIG. 13 except for a design change indicated hereinafter.

In the noise reduction circuit of FIG. 17, the provisional determination circuit 603 is directly connected to the NR calculation circuit 604. The first input terminal of the subtracter 641 (see FIG. 14) within the NR calculation circuit 604 receives the output signal of the delay circuit 602 while the second input terminal of the subtracter 641 receives the output signal of the provisional determination circuit 603.

What is claimed is:

1. An automatic equalization system comprising:
   an analog-to-digital converter for periodically sampling an analog signal representative of digital information in response to a sampling clock signal, and for converting every sample of the analog signal into a corresponding digital sample to convert the analog signal into a corresponding digital signal;
   first means for detecting a phase error of the sampling clock signal in response to a correlation between samples of the digital signal generated by the analog-to-digital converter;
   second means for controlling a frequency of the sampling clock signal in response to the phase error detected by the first means;
   a variable filter for subjecting the digital signal generated by the analog-to-digital converter to a variable filtering process to convert the digital signal generated by the analog-to-digital converter into a filtering-resultant signal, the filtering process corresponding to a waveform equalization process;
   third means for detecting an amplitude error of the digital signal generated by the analog-to-digital converter in response to a correlation between samples of the filtering-resultant signal generated by the variable filter; and
   fourth means for controlling the filtering process implemented by the variable filter in response to the amplitude error detected by the third means;
   wherein the analog-to-digital converter, the first means, and the second means compose a phase locked loop while the variable filter, the third means, and the fourth means compose an amplitude error correcting loop separate from the phase locked loop.

2. An automatic equalization system as recited in claim 1, wherein the first means comprises means for detecting the phase error in response to three successive samples of the digital signal generated by the analog-to-digital converter.

3. An automatic equalization system as recited in claim 1, wherein the phase error of the sampling clock signal which is detected by the first means is defined relative to the analog signal.

4. An automatic equalization system as recited in claim 1, wherein the first means comprises means for comparing a level of every sample of the digital signal generated by the analog-to-digital converter with a reference level, means for adaptively changing the reference level in response to the digital signal generated by the analog-to-digital converter, and means for detecting the phase error in response to a result of the level comparison.

5. A phase lock control circuit comprising:
   an analog-to-digital converter for periodically sampling an analog signal representative of digital information in response to a sampling clock signal, and for converting every sample of the analog signal into a corresponding digital sample to convert the analog signal into a corresponding digital signal;
   first means for detecting a phase error between the sampling clock signal and the analog signal in response to a maximum likelihood related to the analog signal and also in response to a correlation between samples of the digital signal generated by the analog-to-digital converter; and
   second means for controlling a frequency of the sampling clock signal in response to the phase error detected by the first means;
   wherein the first means comprises third means for detecting a specific sample of the digital signal which corresponds to a maximum likelihood and which corresponds to one of a valley and a peak in waveform, fourth means for detecting a level difference between a sample of the digital signal which immediately precedes the specific sample detected by the third means and a sample of the digital signal which immediately follows the specific sample detected by the third means, and fifth means for detecting the phase error in response to the level difference detected by the fourth means.

* * * * *